US012096671B2

United States Patent
Kato

(10) Patent No.: US 12,096,671 B2
(45) Date of Patent: *Sep. 17, 2024

(54) ORGANIC EL DEVICE AND METHOD FOR MANUFACTURING ORGANIC EL DEVICES

(71) Applicant: SONY SEMICONDUCTOR SOLUTIONS CORPORATION, Kanagawa (JP)

(72) Inventor: Yu Kato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,485

(22) Filed: May 3, 2023

(65) Prior Publication Data

US 2023/0301151 A1    Sep. 21, 2023

Related U.S. Application Data

(63) Continuation of application No. 17/252,795, filed as application No. PCT/JP2019/023742 on Jun. 14, 2019, now Pat. No. 11,678,550.

(30) Foreign Application Priority Data

Jun. 25, 2018 (JP) .................. 2018-119504

(51) Int. Cl.
*H10K 59/35* (2023.01)
*H10K 50/844* (2023.01)
(Continued)

(52) U.S. Cl.
CPC ......... *H10K 59/353* (2023.02); *H10K 50/844* (2023.02); *H10K 59/1201* (2023.02);
(Continued)

(58) Field of Classification Search
CPC ............. H01L 51/5237; H01L 51/5253; H01L 51/5256; H01L 51/5259; H01L 27/3246;
(Continued)

(56) References Cited

U.S. PATENT DOCUMENTS 5,953,585 A    9/1999   Miyaguchi
6,566,156 B1 *  5/2003   Sturm ................ H10K 50/8423
                                                        438/82
(Continued)

FOREIGN PATENT DOCUMENTS

CN      104067692 A    9/2014
JP      09-293589 A    11/1997
(Continued)

OTHER PUBLICATIONS

International Search Report and Written Opinion of PCT Application No. PCT/JP2019/023742, issued on Aug. 27, 2019, 08 pages of ISRWO.

(Continued)

*Primary Examiner* — Victoria K. Hall
(74) *Attorney, Agent, or Firm* — CHIP LAW GROUP

(57) ABSTRACT

An organic EL device is constructed with a structure that can prevent deterioration in characteristics. An organic EL device is provided that includes at least two or more subpixels each including an organic compound layer including at least a light-emitting layer that emits light of a different color from the other light-emitting layer(s), the organic compound layer being interposed between a first electrode and a second electrode in a stacking manner, the subpixels being disposed separately from one another on a plane perpendicular to a direction of the stacking. Lateral surfaces of the organic compound layers are covered with films (Continued)

differing from subpixel to subpixel. This structure can prevent the organic EL device from deterioration in characteristics.

19 Claims, 24 Drawing Sheets

(51) Int. Cl.
  *H10K 59/12*    (2023.01)
  *H10K 59/122*   (2023.01)
  *H10K 59/80*    (2023.01)
  *H10K 71/00*    (2023.01)
  *H10K 102/00*   (2023.01)

(52) U.S. Cl.
  CPC ......... *H10K 59/122* (2023.02); *H10K 59/873* (2023.02); *H10K 71/00* (2023.02); *H10K 2102/351* (2023.02)

(58) Field of Classification Search
  CPC .. H10K 50/84; H10K 50/844; H10K 50/8445; H10K 50/846; H10K 59/122; H10K 59/87; H10K 59/873; H10K 59/8731; H10K 59/874
  See application file for complete search history.

(56) References Cited

U.S. PATENT DOCUMENTS

| | | | | |
|---|---|---|---|---|
| 11,678,550 | B2* | 6/2023 | Kato | H10K 50/844 257/40 |
| 2009/0121239 | A1* | 5/2009 | Asaki | H10K 50/852 257/89 |
| 2013/0134449 | A1* | 5/2013 | Chen | H10K 59/1795 438/34 |
| 2016/0343767 | A1 | 11/2016 | Nakatsuka et al. | |
| 2016/0343787 | A1* | 11/2016 | Wu | H10K 59/00 |
| 2019/0088725 | A1* | 3/2019 | Yamamoto | H10K 59/38 |
| 2019/0131528 | A1* | 5/2019 | Donoghue | C23C 14/042 |

FOREIGN PATENT DOCUMENTS

| | | |
|---|---|---|
| JP | H09293589 A | 11/1997 |
| JP | 2004127726 A | 4/2004 |
| JP | 2009-170336 A | 7/2009 |
| JP | 2010045050 A | 2/2010 |

OTHER PUBLICATIONS

International Preliminary Report on Patentability of PCT Application No. PCT/JP2019/023742, issued on Jan. 7, 2021, 7 pages of English Translation and 06 pages of IPRP.

Non-Final Office Action for U.S. Appl. No. 17/252,795, issued on Aug. 18, 2022, 16 pages.

Notice of Allowance for U.S. Appl. No. 17/252,795, issued on Feb. 1, 2023, 10 pages.

* cited by examiner

ORGANIC EL DEVICE AND METHOD FOR MANUFACTURING ORGANIC EL DEVICES

CROSS REFERENCE TO RELATED APPLICATIONS

This application is a continuation of U.S. Ser. No. 17/252,795 filed on Dec. 16, 2020, now U.S. Pat. No. 11,678,550, issued on Jun. 13, 2023, which is a U.S. National Phase of International Patent Application No. PCT/JP2019/023742 filed on Jun. 14, 2019, which claims priority benefit of Japanese Patent Application No. JP 2018-119504 filed in the Japan Patent Office on Jun. 25, 2018. Each of the above-referenced applications is hereby incorporated herein by reference in its entirety.

FIELD

The present disclosure relates to an organic EL device and a method for manufacturing organic EL devices.

BACKGROUND

In recent years, development is underway on displays using organic EL devices (hereinafter, organic EL devices are sometimes written simply as light-emitting devices). A display using organic EL devices has a structure in which an organic compound layer including at least a light-emitting layer, and a second electrode are stacked on first electrodes disposed separately from one another with respect to individual pixels. Each pixel is composed of a plurality of subpixels such as R, G and B.

The subpixel forming technologies include a method that patterns colors using a white light-emitting device and RGB color filters, and a method that patterns colors by the pixelation of a red light-emitting device, a green light-emitting device and a blue light-emitting device.

The method using a white light-emitting device and RGB color filters has a drawback in that the color filters attenuate the light that is extracted. Thus, further developments have been desired of the method involving the pixelation of a red light-emitting device, a green light-emitting device and a blue light-emitting device.

In the pixelation method, for example, light-emitting devices of different colors are pixelated by a mask deposition method in which light-emitting layers are deposited with respect to individual pixels using a mask, a printing method in which light-emitting layers are formed by application using an inkjet head with respect to individual pixels, or an etching method in which a light-emitting layer formed on the entire surface is patterned with respect to individual pixels by etching. The etching method is capable of forming pixels with high accuracy and is particularly suited for the manufacturing of high-definition displays. For example, Patent Literature 1 discloses a technique for pixelating an organic EL device by the etching method.

CITATION LIST

Patent Literature

Patent Literature 1: Japanese Patent Application Laid-open No. 2009-170336

SUMMARY

Technical Problem

Unfortunately, organic compound layers in an organic EL device are sometimes deteriorated in characteristics as a result of reaction with, for example, oxygen or water in the air, process gases or chemical solutions during the process in which a red light-emitting device, a green light-emitting device and a blue light-emitting device are sequentially pixelated in a repeated manner. In particular, the lateral surface of the organic compound layers is prone to deterioration due to the exposure to the air or the like.

In view of the circumstances discussed above, it is desirable that an organic EL device be constructed with a structure that can prevent deterioration in characteristics.

Solution to Problem

In accordance with the present disclosure, an organic EL device comprising at least two or more subpixels each including an organic compound layer including at least a light-emitting layer that emits light of a different color from the other light-emitting layer(s), the organic compound layer being interposed between a first electrode and a second electrode in a stacking manner, the subpixels being disposed separately from one another on a plane perpendicular to a direction of the stacking, wherein lateral surfaces of the organic compound layers are covered with films differing from subpixel to subpixel, is provided.

Furthermore, in accordance with the present disclosure, a method for manufacturing an organic EL device, the method comprising forming at least two or more subpixels each including an organic compound layer including at least a light-emitting layer that emits light of a different color from the other light-emitting layer(s), the organic compound layer being interposed between a first electrode and a second electrode in a stacking manner, the subpixels being formed separately from one another on a plane perpendicular to a direction of the stacking, wherein the forming of the subpixels comprises forming a film that covers a lateral surface of the organic compound layer, every time the organic compound layer that emits light of a color is shaped, is provided.

According to the present disclosure, the lateral surfaces of the organic compound layers in the subpixels are not exposed and thus the organic compound layers can be prevented from exposure to the outside air, process gases, chemical solutions and the like in the process of forming the subpixels.

Advantageous Effects of Invention

According to the present disclosure, it is possible to provide an organic EL device that can be prevented from deterioration in characteristics.

Incidentally, the advantageous effects described above are not necessarily limitative, and any of the effects described in the present specification or other effects that may be anticipated from the present specification may be produced in addition to the above advantageous effects or in place of the above advantageous effects.

DESCRIPTION OF EMBODIMENTS

Figure 1:
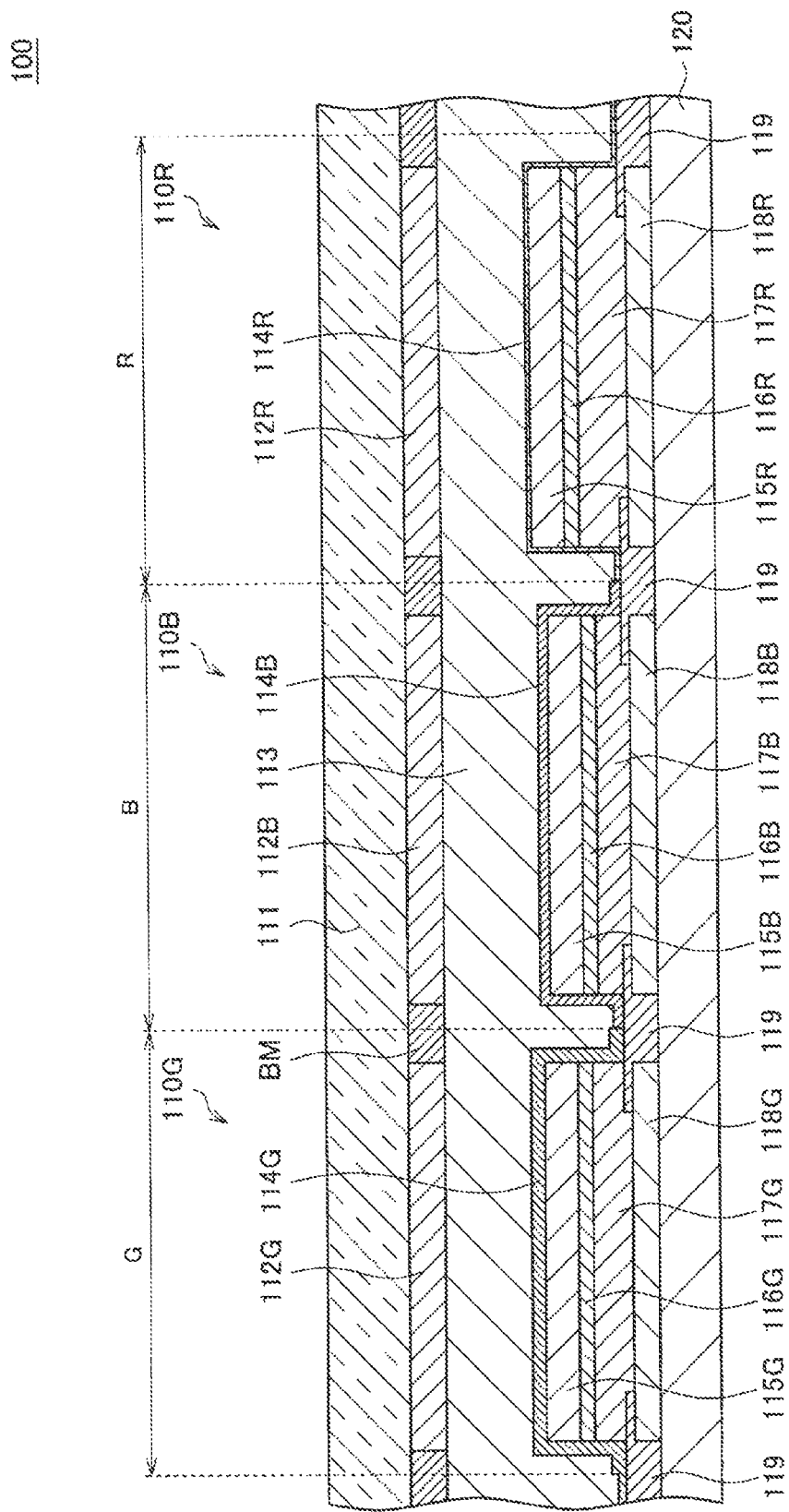
FIG. 1 is a sectional view in stacking direction of an organic EL device according to an embodiment of the present disclosure.

Preferred embodiments of the present disclosure will be described in detail below with reference to the accompanying drawings. In the present specification and the drawings, structural elements having substantially the same functional configuration are designated by the same reference numerals, thereby avoiding duplicate descriptions.

The explanations will be given in the following order.
1. Outlines of organic EL devices
2. Configurations of organic EL devices
3. Methods for manufacturing organic EL devices
4. Modified examples
5. Planar layouts of organic EL devices 1. Outlines of Organic EL Devices First, the outline of an organic EL device according to an embodiment of the present disclosure will be described. The organic EL device of the present disclosure includes organic compound layers including at least light-emitting layers that emit light of colors different from one another. Furthermore, a first electrode and a second electrode are stacked together with the organic compound layer interposed therebetween. At least two or more subpixels having the above configuration are disposed separately from one another on a plane perpendicular to the stacking direction.

In the organic EL device, an electric field applied between the first electrode and the second electrode induces the injection of holes and electrons from the first electrode and the second electrode, and the holes and the electrons recombine in the organic compound layer to emit light. In the manufacturing of this organic EL device, the organic compound layers are exposed to atmospheric water, oxygen, process gases, chemical solutions, and the like during the sequential subpixel production, and consequently the organic compound layers are sometimes deteriorated.

Thus, the organic EL device of the present disclosure is configured so that the lateral surfaces of the organic compound layers are covered with films differing from subpixel of one color to subpixel of other color, whereby the organic compound layers are prevented from deterioration.

2. Configurations of Organic EL Devices

The configuration of an organic EL device according to an embodiment of the present disclosure will be described with reference to FIG. 1. FIG. 1 is a sectional view schematically illustrating a section, cut in the stacking direction, of an organic EL device according to an embodiment of the present disclosure.

In the following description, the direction in which the layers in an organic EL device 100 are stacked is defined as the vertical direction. Furthermore, the side on which a substrate 120 is disposed is defined as the downside, and the side on which a counter glass 111 is disposed is defined as the upside. The drawings referred to in the following description may exaggerate the size of some of the constituent members for the purpose of illustration. Thus, the relative sizes of constituent members illustrated in the drawings are not necessarily true to the actual size relations between the constituent members.

Furthermore, the regions that emit different colors are illustrated as being composed of a green light emitting region G that emits green light, a blue light emitting region B that emits blue light, and a red light emitting region R that emits red light. The subpixels formed in the different color emitting regions are a subpixel 110G that emits green light, a subpixel 110B that emits blue light, and a subpixel 110R that emits red light, respectively (hereinbelow, these subpixels are sometimes not distinguished from one another and are written collectively as subpixels 110).

First, the configuration of the organic EL device will be described from the downside sequentially in the stacking direction. As illustrated in FIG. 1, the substrate 120 that supports the stack structure of the organic EL device is disposed on the lowermost side of the organic EL device.

The substrate 120 extends uniformly over the place where the organic EL device is disposed. For example, the substrate 120 has a circuit configuration (not illustrated) such as a drive transistor for driving the organic EL device, formed by the semiconductor process.

Over the substrate 120, three electrodes, namely, a first electrode 118G, a first electrode 118B and a first electrode 118R (hereinbelow, these electrodes are sometimes not distinguished from one another and are written collectively as first electrodes 118) are disposed separately from one another in the direction perpendicular to the stacking direction in the sectional view. The number of the first electrodes 118 that are arranged is not limited and may be determined appropriately. Between each pair of the first electrodes 118, a window layer 119 is disposed that separates the first electrodes 118 from each other, thereby defining one subpixel. The window layer 119 may partially overlap with an end portion of the first electrode 118. Specifically, the window layer 119 may be formed of SiON.

The first electrodes 118 function as electrodes of the organic EL device 100. When the first electrodes 118 function as anodes, the first electrodes 118 may be formed of, for example, a metal having a high work function such as platinum, gold, silver, chromium, tungsten, nickel, copper, iron, cobalt or tantalum. Alternatively, the first electrodes 118 may be formed of an alloy of the above high work function metals, specifically, Ag—Pb—Cu alloy or Al—Nd alloy.

Still alternatively, the first electrodes 118 may be formed of a conductive material having a small value of work function and high light reflectance such as aluminum (Al) or an alloy including aluminum. In this case, a hole injection layer or the like may be formed in the stack structures of the subpixels to enhance hole injection properties, thereby allowing the first electrodes 118 to be used as anode electrodes.

Still alternatively, the first electrodes 118 may be formed of indium oxide, indium-tin oxide (ITO; including indium tin oxide, Sn-doped indium oxide, crystalline ITO and amorphous ITO), indium-zinc oxide (IZO: indium zinc oxide), indium-gallium oxide (IGO), indium-doped gallium-zinc oxide (IGZO, In—GaZnO$_4$), IFO (F-doped In$_2$O$_3$), ITiO (Ti-doped In$_2$O$_3$), InSnZnO, tin oxide (SnO$_2$), ATO (Sb-doped SnO$_2$), FTO (F-doped SnO$_2$), zinc oxide (ZnO), aluminum oxide-doped zinc oxide (AZO), gallium-doped zinc oxide (GZO), B-doped ZnO, AlMgZnO (aluminum oxide- and magnesium oxide-doped zinc oxide), antimony oxide, titanium oxide, NiO, spinel oxide, or an oxide having a YbFe$_2$O$_4$ structure. Still alternatively, the first electrodes 118 may be formed of a multilayer film having a base layer of gallium oxide, titanium oxide, niobium oxide, nickel oxide or the like, or may be formed of a stack structure in which a transparent conductive material having excellent hole injection properties such as an oxide of indium and tin (ITO) or an oxide of indium and zinc (IZO) is stacked on a reflective film having high light reflecting properties such as aluminum.

When, on the other hand, the first electrodes 118 function as cathode electrodes, it is desirable that the first electrodes 118 be composed of a conductive material having a small value of work function and high light reflecting properties. It is, however, also possible that the first electrodes 118 are formed of a conductive material with high light reflectance that is used as anode electrodes. In such a case, an electron injection layer or the like may be formed in the stack structures of the subpixels to enhance electron injection properties, thereby allowing the first electrodes 118 to be used as cathode electrodes.

Over the first electrode 118G, the first electrode 118B and the first electrode 118R, an organic compound layer 117G, an organic compound layer 117B and an organic compound layer 117R that each have the same planar shape as the planar shape of the corresponding first electrode 118 are disposed (hereinbelow, these organic compound layers are sometimes not distinguished from one another and are written collectively as organic compound layers 117).

The organic compound layers 117 each include at least a light-emitting layer, and emit light independently from other subpixels. In the light-emitting layer, an electric field is generated between the first electrode 118 and a second electrode 116 to bring about the recombination of electrons and holes injected from the first electrode 118 and the second electrode 116, thus resulting in light emission. The light-emitting layer is formed of an organic light-emitting material. The organic EL device illustrated in FIG. 1 has, from the left, an organic compound layer 117G that emits green light (wavelength: 495 nm to 570 nm), an organic compound layer 117B that emits blue light (wavelength: 450 nm to 495 nm), and an organic compound layer 117R that emits red light (wavelength: 620 nm to 750 nm).

When the first electrodes 118 are anodes and the second electrodes 116 are cathodes, enhanced emission efficiency may be attained by configuring the organic compound layers 117 to have a structure in which an electron transport layer, a light-emitting layer and a hole transport layer are stacked in this order from the first electrode 118. Alternatively, when the first electrodes 118 are anodes and the second electrodes 116 are cathodes, the organic compound layers 117 may have a structure in which an electron injection layer, an electron transport layer, a light-emitting layer, a hole transport layer and a hole injection layer are stacked in this order from the first electrode 118.

The electron transport layer is a layer that enhances the efficiency of electron transport to the light-emitting layer, and the electron injection layer is a layer that enhances the efficiency of electron injection from the first electrode 118 to the electron transport layer. The hole transport layer is a layer that enhances the efficiency of hole transport to the light-emitting layer, and the hole injection layer is a layer that enhances the efficiency of hole injection from the second electrode 116 to the hole transport layer.

For example, the hole injection layer may include a hexaazatriphenylene derivative represented by the following chemical formula (1).

[Chem. 1]

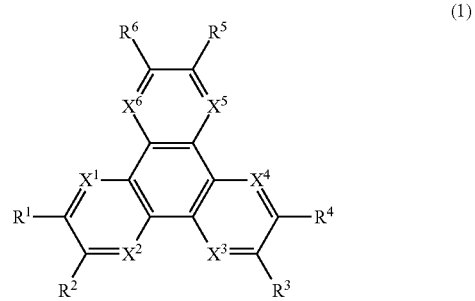

Here, $R^1$ to $R^6$ are each independently a substituent that may be selected from hydrogen, halogen, a hydroxy group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group and a silyl group, and adjacent groups $R^m$ (m=1 to 6) may be bonded to each other via a ring structure. Furthermore, $X^1$ to $X^6$ are each independently a carbon atom or a nitrogen atom.

More specifically, the hole injection layer may include, for example, the hexaazatriphenylene derivative represented by the following chemical formula (2).

[Chem. 2]

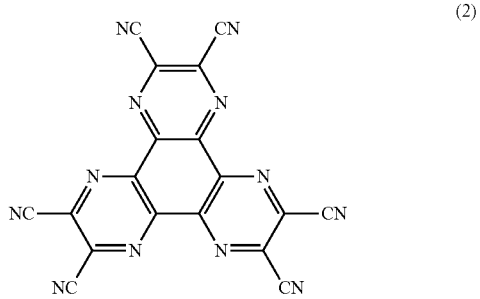

(2)

For example, the hole transport layer may include 4,4,4-tris(3-methylphenylphenylamino)triphenylamine (m-MTDATA) or α-naphthylphenyldiamine (αNPD).

For example, the electron transport layer may include 8-hydroxyquinoline aluminum (Alq3).

For example, the electron injection layer may include LiF or $Li_2O$. Furthermore, the electron injection layer may be formed as an organic compound layer doped with a donor such as an alkali metal.

Over the organic compound layers 117 described above, a second electrode 116G, a second electrode 116B and a second electrode 116R that each have the same planar shape as the planar shape of the corresponding organic compound layer 117 are disposed (hereinbelow, these second electrodes are sometimes not distinguished from one another and are written collectively as second electrodes 116). Specifically, the second electrode 116G is disposed over the organic compound layer 117G, the second electrode 116B over the organic compound layer 117B, and the second electrode 116R over the organic compound layer 117R.

The second electrodes 116 have a function of applying an electric field in combination with the first electrodes 118 to cause the organic compound layers 117 to emit light. When the second electrodes 116 function as cathode electrodes, the second electrodes 116 may be formed of a metal oxide. Examples of the metal oxides that may be used include transparent conductive materials such as IZO, ITO, ZnO, SnO, AZO and GZO.

Alternatively, the second electrodes 116 may be formed of, for example, aluminum (Al), silver (Ag), magnesium (Mg), calcium (Ca), sodium (Na), strontium (Sr), an alloy of an alkali metal or an alkaline earth metal and silver, an alloy of magnesium and silver, an alloy of magnesium and calcium, an alloy of aluminum and lithium (Li), or the like.

Over the second electrodes 116, a hard mask 115G, a hard mask 115B and a hard mask 115R that each have the same planar shape as the planar shape of the corresponding second electrode 116 are disposed (hereinbelow, these hard masks are sometimes not distinguished from one another and are written collectively as hard masks 115). Specifically, the hard mask 115G is disposed over the second electrode 116G, the hard mask 115B over the second electrode 116B, and the hard mask 115R over the second electrode 116R. The hard masks 115 function as masks during the formation of subpixels by etching.

In the organic EL device 100 of the present disclosure, films 114 are disposed on the upper surfaces of the hard masks 115 and on the lateral surfaces of the stack structures composed of the organic compound layer 117, the second electrode 116 and the hard mask 115 described above. The films 114 are different from subpixel to subpixel.

In the green light emitting region G, as illustrated in FIG. 1, a uniform film 114G extends along the direction in which the subpixel 110G, the subpixel 110B and the subpixel 110R are arranged, so as to cover a portion of the upper surface of the window layer 119, the upper surface of the hard mask 115G, the lateral surface of the organic compound layer 117G, the lateral surface of the second electrode 116G, and the lateral surface of the hard mask 115G.

In the blue light emitting region B, a uniform film 114B differing from the film 114G is disposed on a portion of the upper surface of the window layer 119, the upper surface of the hard mask 115B, the lateral surface of the organic compound layer 117B, the lateral surface of the second electrode 116B, and the lateral surface of the hard mask 115B.

In the red light emitting region R, a uniform film 114R differing from the film 114G and the film 114B is disposed on a portion of the upper surface of the window layer 119, the upper surface of the hard mask 115R, the lateral surface of the organic compound layer 117R, the lateral surface of the second electrode 116R, and the lateral surface of the hard mask 115R. The films 114 disposed on the lateral surfaces of the organic compound layers 117 and the lateral surfaces of the second electrodes 116 can prevent the organic compound layers 117 and the second electrodes 116 from being exposed to atmospheric water, oxygen, process gases, and the like during processes such as the manufacturing of organic EL devices. The configuration described above can prevent the organic compound layers 117 and the second electrodes 116 from oxidation and the like, thus making it possible to suppress deterioration in characteristics of the organic EL devices.

In the organic EL device 100 of the present disclosure, as described hereinabove, the film 114G, the film 114B and the film 114R disposed in the subpixel 110G, the subpixel 110B and the subpixel 110R are different from one another. For example, the film 114G, the film 114B and the film 114R may differ in film thickness from one another. The film 114G, the film 114B and the film 114R differing in film thickness from one another may be produced more efficiently than when they are formed with the same film thickness.

Referring to FIG. 1, the film 114G may have the largest film thickness, the film 114B may have the second largest film thickness, and the film 114R may have the smallest film thickness. The film thicknesses of these films may be determined appropriately. Furthermore, the film thicknesses of the film 114G, the film 114B and the film 114R may change in the order of the formation of the subpixels in the organic EL device. For example, the films may be formed with increasing film thicknesses in the order of the formation of the subpixels in the organic EL device.

The film thickness may vary depending on the film forming method. When, for example, the ALD (atomic layer deposition) method is adopted that offers higher barrier properties against oxygen, water and the like, the films attain high lateral surface protection effects when the film thickness is 50 nm or less, and can effectively protect the lateral surfaces even when the film thickness is 10 nm or less.

Furthermore, the film 114G, the film 114B and the film 114R may differ in film quality from one another. The term film quality means properties of the films that change depending on the film formation conditions in the process of producing the films. Examples of the film formation conditions include film forming methods, film forming pressures, film forming temperatures, and film forming powers. Examples of the film formation conditions further include the types, mixing ratios and flow rates of process gases. Film formation under different conditions produces different results such as different densities or hardnesses of the films.

Furthermore, the film 114G, the film 114B and the film 114R may differ in materials from one another. At least one or more of the film 114G, the film 114B and the film 114R may be formed of an inorganic material. Specifically, at least one or more of the films may include any one or more of AlO, TiO, SiN, SiON and SiO as the inorganic materials. The film 114G, the film 114B and the film 114R including these materials can attain higher barrier properties against oxygen or water.

Incidentally, at least one or more of the film 114G, the film 114B and the film 114R may be formed of an organic material. Specifically, at least one or more of the film 114G, the film 114B and the film 114R may be a hydrocarbon containing a fluorine atom.

The film 114G, the film 114B and the film 114R are not limited to monolayer films, and may be laminates composed of a plurality of films. For example, the film 114G, the film 114B and the film 114R may be each formed of a laminate including multiple different films.

A filler layer 113 is disposed over the film 114G, the film 114B and the film 114R. The filler layer 113 seals each of the organic EL device 100, thereby functioning to prevent the entry of water and the like into the organic compound layers 117. Furthermore, the filler layer 113 also has a function of bonding members disposed over the filler layer 113 such as a counter glass 111 described later. For example, the filler layer 113 may be formed of an organic resin. The organic resin may be a known material such as a thermosetting resin or a UV curable resin.

Furthermore, a gas barrier layer may be formed as a lower layer under the filler layer 113. The filler layer 113 may be a stack structure formed of organic resins, and the gas barrier layer may be formed of an insulating inorganic material. The gas barrier layer has a function of enhancing the gas barrier properties of the subpixels.

The insulating inorganic material that forms the gas barrier layer is a material transmissive to the light generated in the organic compound layers 117, and is desirably composed of a material that transmits, for example, 80% or more of the light generated in the organic compound layers 117. Specific examples of the insulating inorganic materials for forming the gas barrier layers include inorganic amorphous insulating materials. Inorganic amorphous insulating materials do not make grains, and thus have low water permeability and form good protective films. Specifically, the insulating inorganic material for forming the gas barrier layer is desirably a transparent material that is dense and impermeable to water. More specifically, examples of the insulating materials for forming the gas barrier layers include SiNX including amorphous silicon nitride ($\alpha\text{-Si}_{1-x}N_x$), SiOy including amorphous silicon oxide ($\alpha\text{-Si}_{1-y}O_y$), SiON including amorphous silicon oxynitride ($\alpha\text{-SiON}$), amorphous silicon ($\alpha\text{-Si}$), amorphous silicon carbide ($\alpha\text{-SiC}$) and $Al_2O_3$.

Over the filler layer 113, a green color filter 112G, a blue color filter 112B and a red color filter 112R are disposed on planar regions overlapping with the planar regions in which the organic compound layers 117 are disposed in the respective subpixels (these color filters are sometimes not distinguished from one another and are written collectively as color filters 112). Specifically, the green color filter 112G is disposed on a region overlapping with the organic compound layer 117G that emits green light; the blue color filter 112B is disposed on a region overlapping with the organic compound layer 117B that emits blue light; and the red color filter 112R is disposed on a region overlapping with the organic compound layer 117R that emits red light.

The green color filter 112G, the blue color filter 112B and the red color filter 112R adjust the colors or wavelengths of the light emitted from the organic compound layers 117 of the respective subpixels. The green color filter 112G, the blue color filter 112B or the red color filter 112R may be omitted in some cases.

A black matrix layer BM is disposed between the green color filter 112G and the blue color filter 112B, and between the blue color filter 112B and the red color filter 112R. The black matrix layer BM can prevent the mixing of colors caused by the entry of light emitted from the light-emitting layer into the color filter 112 of the adjacent subpixel.

For example, the black matrix layer BM may be a black resin film that contains a black colorant and has an optical density of 1 or more. Specifically, the black matrix layer may be a black polyimide resin. Alternatively, the black matrix layer BM may be a thin film filter utilizing the interference of thin films. For example, the thin film filter is formed by stacking two or more layers of thin films made of a metal, a metal nitride or a metal oxide, and can attenuate light utilizing the interference of the thin films. Specific examples of the thin film filters include an alternate stack of Cr and chromium (III) oxide ($Cr_2O_3$).

A uniform counter glass 111 common to the subpixels is disposed over the layer composed of the color filters 112 and the black matrix BM. The counter glass 111 is formed of a material that transmits the light emitted from the organic compound layers 117, and may be, for example, any of various glass substrates, quartz substrates and the like such as high-strain point glass, soda glass ($Na_2O \cdot CaO \cdot SiO_2$), borosilicate glass ($Na_2O \cdot B_2O_3 \cdot SiO_2$) and lead glass ($Na_2O$).

3. Methods for Manufacturing Organic EL Devices

The structure of the organic EL device has been described hereinabove. Next, a method for manufacturing the organic EL device 100 illustrated in FIG. 1 will be described with reference to FIGS. 2 to 18. FIGS. 2 to 18 are views illustrating example steps in the manufacturing of the organic EL device 100.

Figure 2:
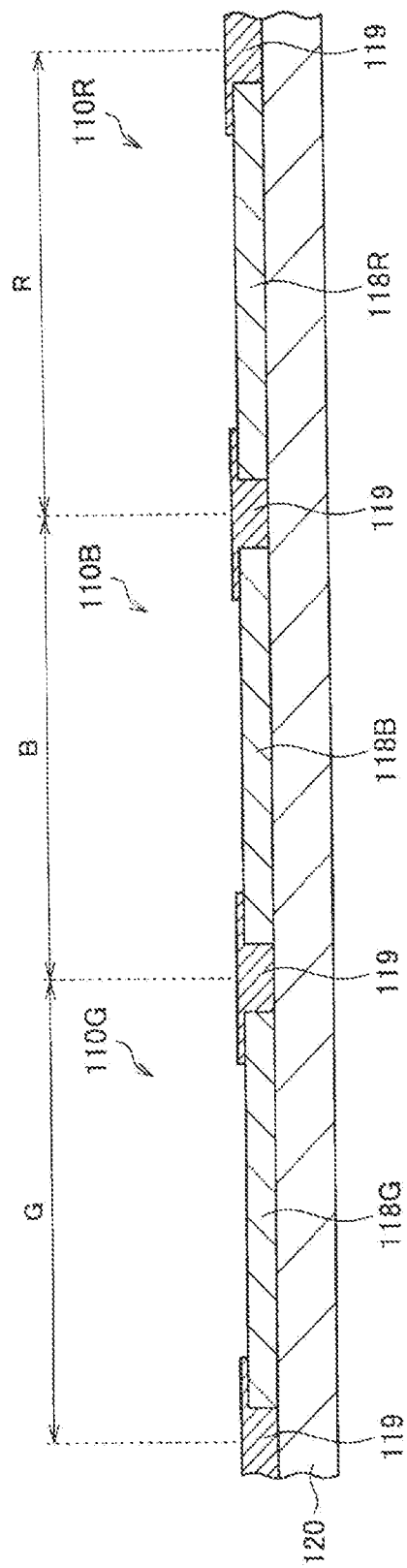
FIG. 2 is a view illustrating an example step in the manufacturing of an organic EL device according to the embodiment.

First, as illustrated in FIG. 2, a substrate 120 is formed that will support the stack structure of the organic EL device 100 and includes drive circuits such as a drive transistor for driving the organic EL device 100. On the substrate 120, first electrodes 118 and a window layer 119 are formed by a sputtering method, CVD (chemical vapor deposition) or ALD (atomic layer deposition).

Specifically, after a circuit layer including drive circuits is formed on a Si substrate, a metal layer made of ITO is formed on the substrate 120, and the metal layer is patterned by a photolithographic technique and an etching technique to form first electrodes 118. Thereafter, an insulating layer is formed so as to fill the regions between the patterned metal layers that separate the subpixels from one another, thereby forming a window layer 119. Specifically, the window layer 119 may be formed of SiON or the like.

Figure 3:
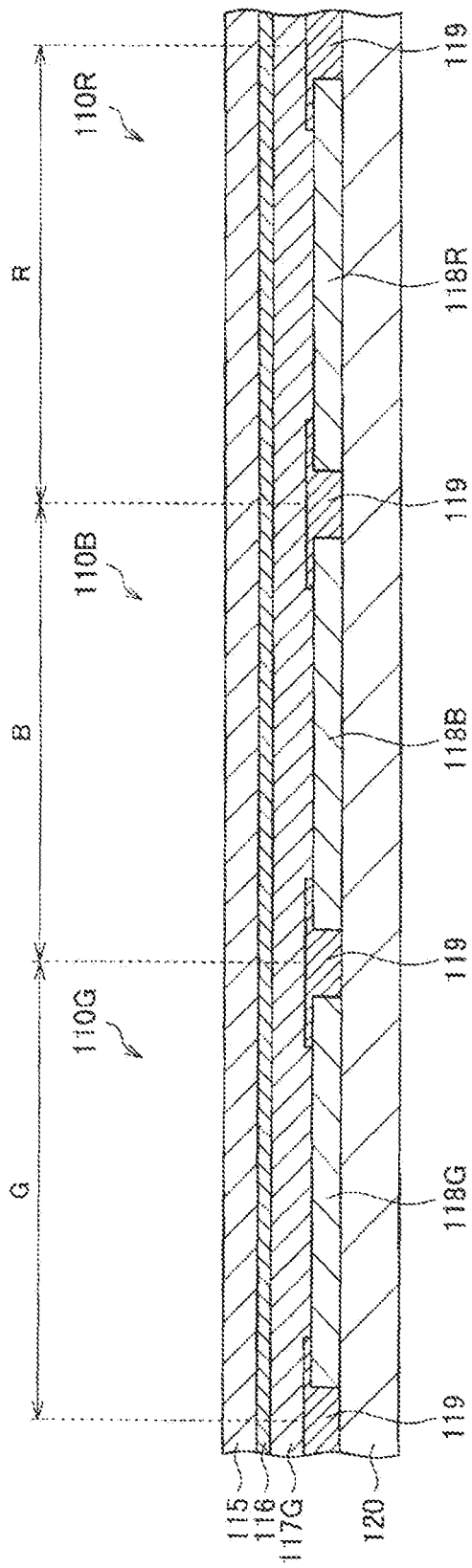
FIG. 3 is a view illustrating an example step in the manufacturing of an organic EL device according to the embodiment.

Next, referring to FIG. 3, an organic compound layer 117G is formed over the first electrodes 118 and the window layer 119 by a coating method such as a vacuum evaporation method, a spin coating method or a die coating method. A second electrode 116G and a hard mask 115G are further formed over the organic compound layer 117G.

Specifically, the organic compound layer 117G may be formed as a stack structure including the materials described hereinabove. For example, the second electrode 116G may be formed of a material including IZO, and the hard mask 115G may be formed of a material including SiN. Alternatively, the hard mask 115G may be formed as a CVD film including SiO, and SiON, or as an ALD film including AlO, TiO, and SiO. The second electrode 116G is not limited to IZO, and may be another metal oxide such as ITO or a metal electrode such as MgAg alloy, Al or Ca. Furthermore, the hard mask 115G may be omitted.

Figure 4:
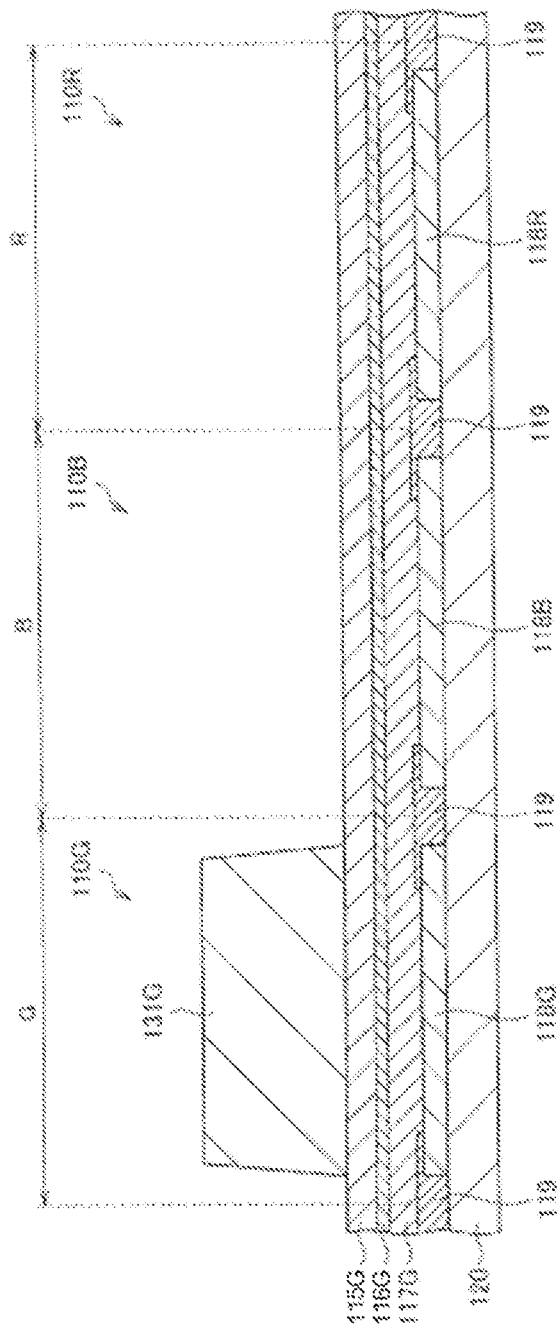
FIG. 4 is a view illustrating an example step in the manufacturing of an organic EL device according to the embodiment.

Furthermore, referring to FIG. 4, a resist 131G having the same planar shape as the planar shape of the first electrode 118G is formed by photolithography over the desired portion of the hard mask 115G. The resist 131G functions as a mask during the etching of the hard mask 115G.

Figure 5:
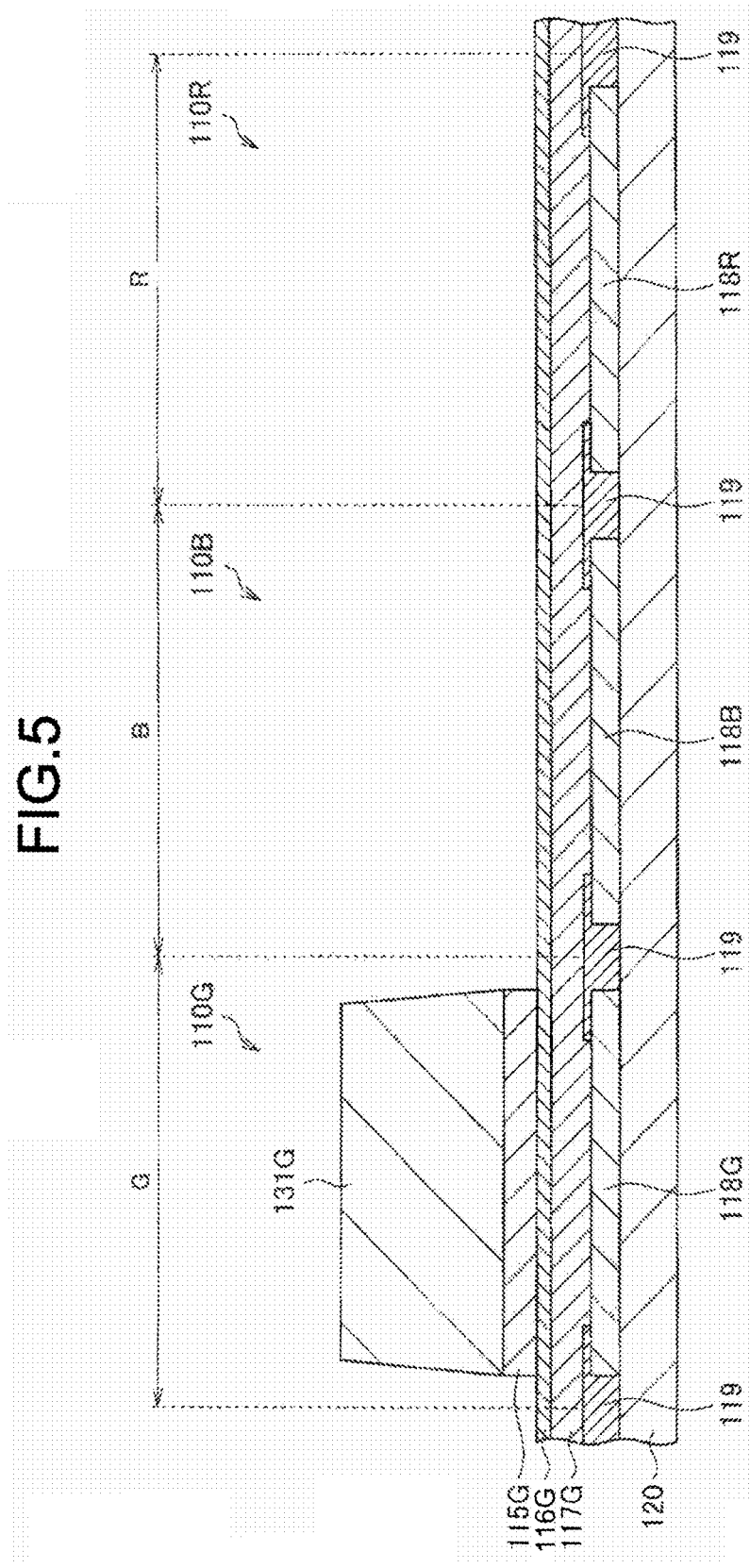
FIG. 5 is a view illustrating an example step in the manufacturing of an organic EL device according to the embodiment.

Next, referring to FIG. 5, the hard mask 115G is patterned by etching the hard mask 115G through the resist 131G as a mask. The etching of the hard mask 115G may be performed by plasma etching using a fluorinated hydrocarbon gas.

Figure 6:
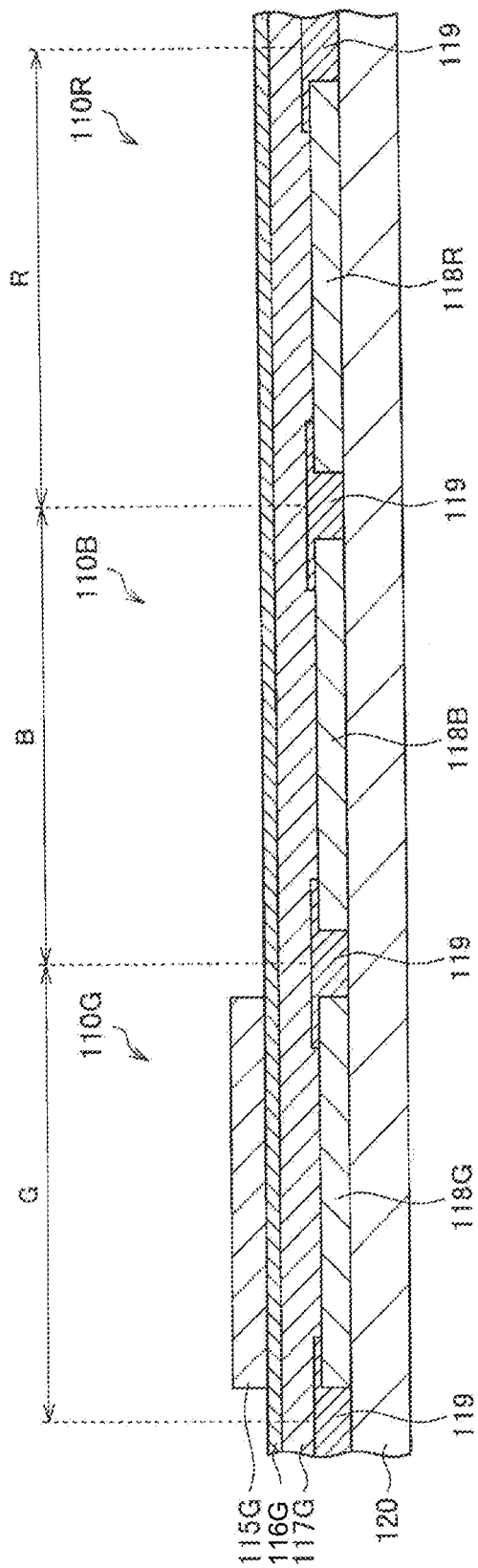
FIG. 6 is a view illustrating an example step in the manufacturing of an organic EL device according to the embodiment.

Thereafter, referring to FIG. 6, the resist 131G over the hard mask 115G being protected is removed. The resist 131G is removed by asking. The resist removal may be performed after the step of etching the second electrode 116G and the organic compound layer 117G illustrated later in FIG. 7.

Figure 7:
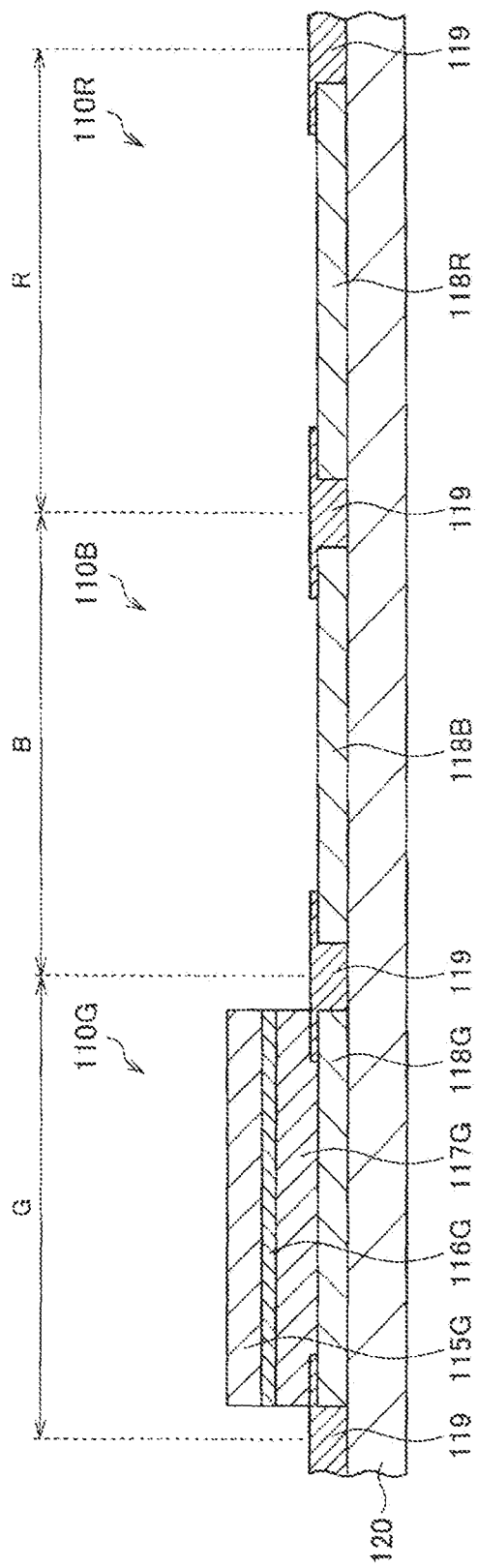
FIG. 7 is a view illustrating an example step in the manufacturing of an organic EL device according to the embodiment.

Next, referring to FIG. 7, the second electrode 116G and the organic compound layer 117G are etched while using the hard mask 115G as a mask. Specifically, the second electrode 116G and the organic compound layer 117G that are stacked under the hard mask 115G with overlap are protected by the hard mask 115G and remain after the etching. On the other hand, the second electrode 116G and the organic compound layer 117G in the regions out of the protection by the hard mask 115G are removed by etching. For example, the second electrode 116G formed of IZO is removed by dry etching using argon, and the organic compound layer 117G is removed by dry etching using oxygen. By the process so far, a subpixel in a green light emitting region G is formed. In the present disclosure, the subsequent step is not to start the formation of a next subpixel, but to form a film.

Figure 8:
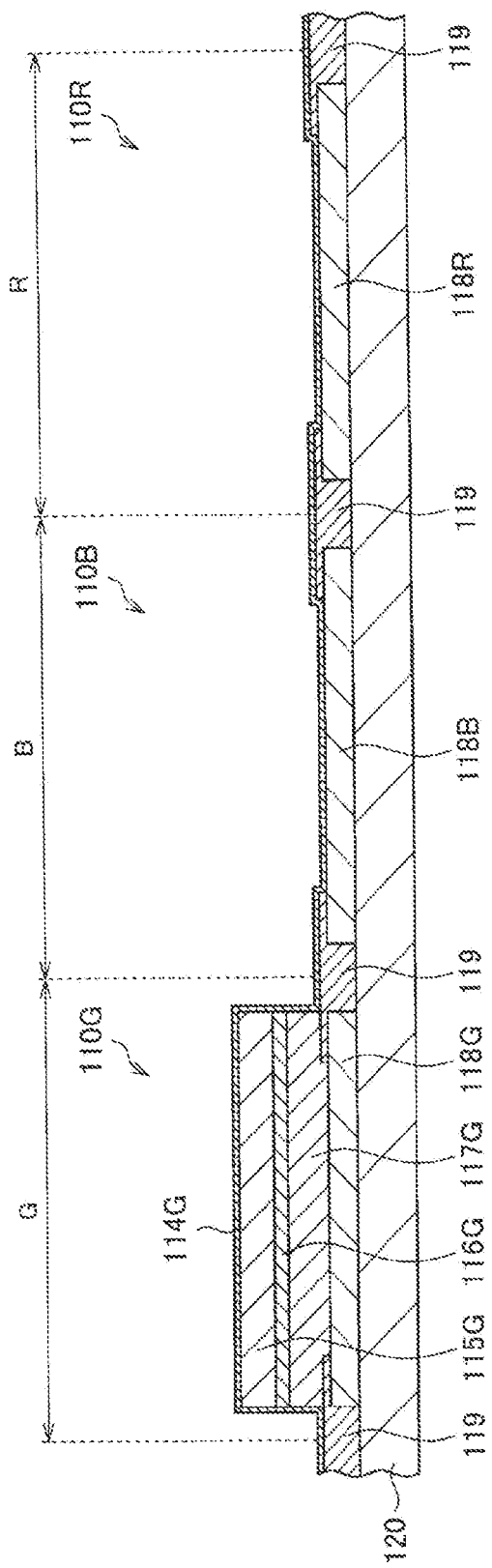
FIG. 8 is a view illustrating an example step in the manufacturing of an organic EL device according to the embodiment.

Referring to FIG. 8, a film 114G is formed on the stack structure of the subpixel in the green light emitting region G before starting the formation of a subpixel that emits light of a different color. Specifically, a film 114G is uniformly formed over the entire surface of the substrate 120 including the green light emitting region G.

For example, the film 114G may be formed of AlO by an ALD method. The film 114G is not limited to AlO, and may be another ALD film such as TiO, or a CVD film such as SiN, SiO or SiON. By performing this step immediately after the dry etching of the organic compound layer 117G, damage such as deterioration on the organic compound layer 117G during subsequent steps can be prevented. In particular, the organic compound layer 117G can be prevented from deterioration due to contact between the lateral surface of the organic compound layer 117G and the process gases used in the formation of other subpixels, atmospheric water, oxygen, or the like.

Figure 9:
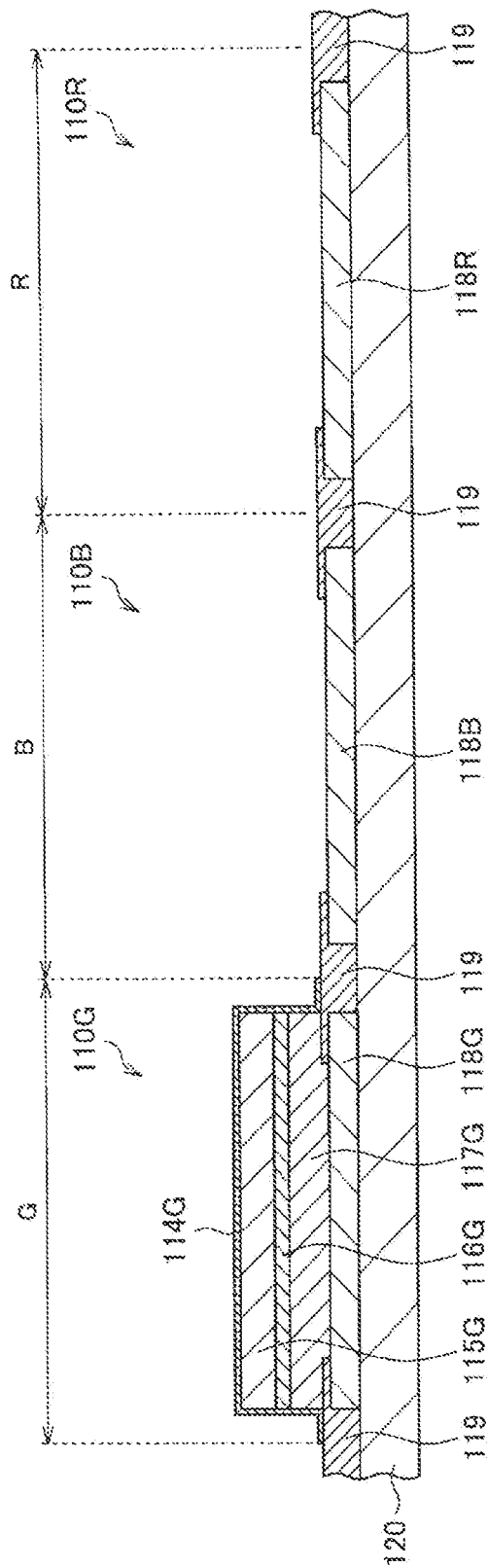
FIG. 9 is a view illustrating an example step in the manufacturing of an organic EL device according to the embodiment.

Next, referring to FIG. 9, the film 114G in the regions other than the green light emitting region G is removed by etching. Specifically, a resist film is formed over the constituents of the green light emitting region G, and the film 114G is etched using the resist as a mask. As a result, the film 114G in the regions other than the green light emitting region G is removed. The etching of the film 114G may be performed using a chlorinated gas. The resist is removed by asking.

By the process so far, the formation of a subpixel 110G that emits green light, including the formation of the film 114G, is completed. Subsequently, a subpixel 110B in a blue light emitting region B is formed in the same manner as the subpixel 110G that emits green light is formed. The production of the subpixel 110B that emits blue light will be described with reference to FIGS. 10 to 14.

Figure 10:
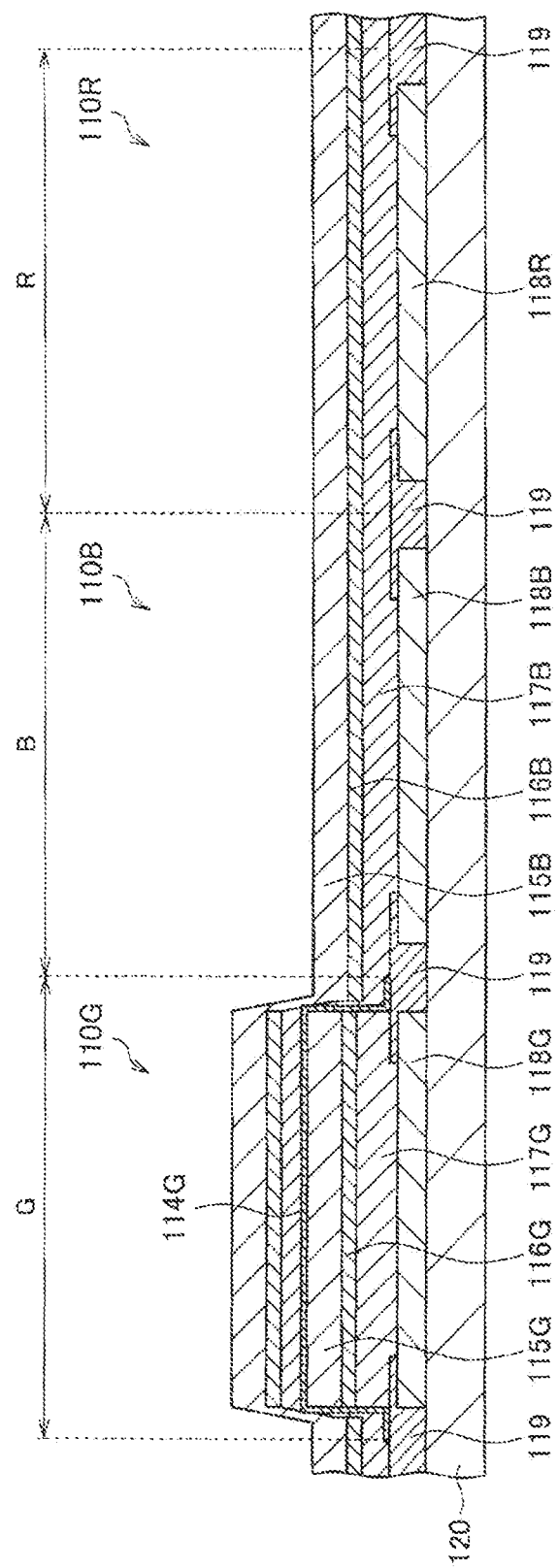
FIG. 10 is a view illustrating an example step in the manufacturing of an organic EL device according to the embodiment.

Referring to FIG. 10, an organic compound layer 117B that emits blue light, a second electrode 116B and a hard mask 115B are formed on the entire surface of the substrate 120 in the same manner as the formation of the subpixel 110G that emits green light.

Figure 11:
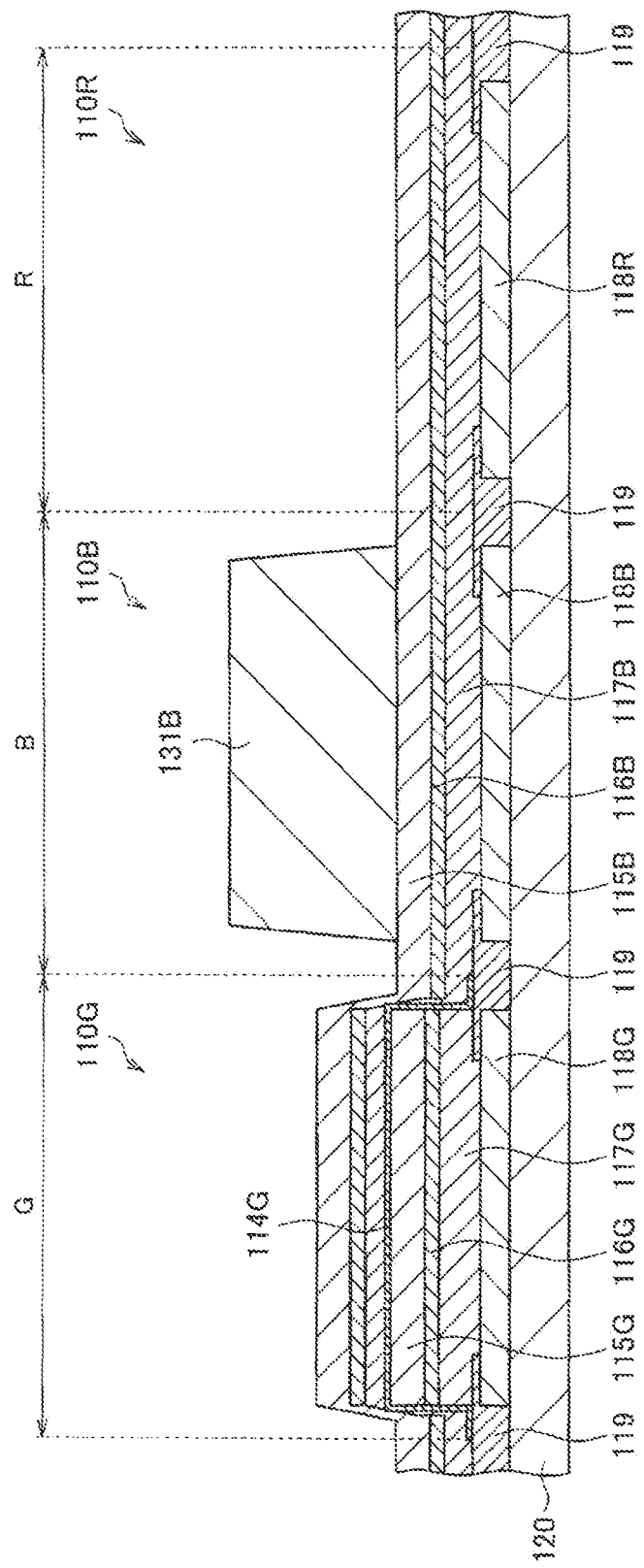
FIG. 11 is a view illustrating an example step in the manufacturing of an organic EL device according to the embodiment.

Next, referring to FIG. 11, a resist 131B having the same planar shape as the planar shape of the first electrode 118B is formed by photolithography over the desired portion of the hard mask 115B. The resist 131B functions as a mask during the etching of the hard mask 115B.

Figure 12:
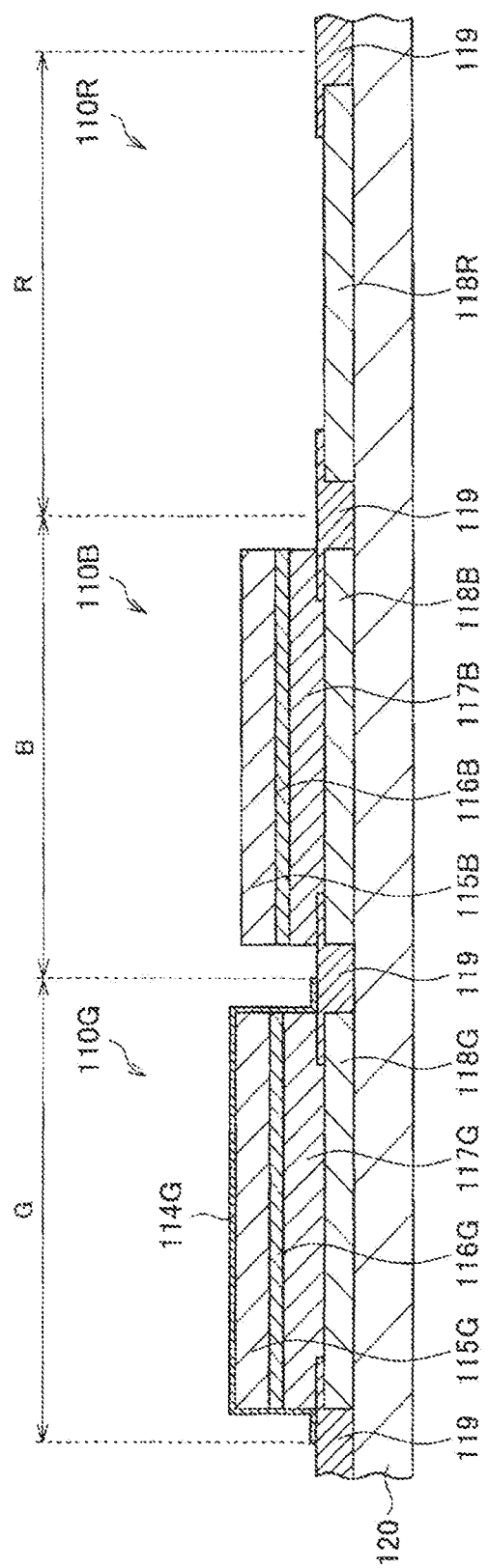
FIG. 12 is a view illustrating an example step in the manufacturing of an organic EL device according to the embodiment.

Next, referring to FIG. 12, steps are performed for the formation of a subpixel 110B that emits blue light in the same manner as the steps of forming the subpixel 110G that emits green light. Specifically, the hard mask 115B is patterned by etching using the resist 131B as a mask, and furthermore, the second electrode 116B and the organic compound layer 117B are patterned by etching through the hard mask 115B as a mask. The resist 131B may be removed by asking or the like.

Here, similarly to the steps of forming the subpixel 110G in the green light emitting region G, the etching of the hard mask 115B may be performed by, for example, plasma etching using a fluorinated hydrocarbon gas. The etching of the second electrode 116B formed of IZO may be performed by dry etching using argon, and the etching of the organic compound layer 117B may be performed by dry etching using oxygen.

In the subpixel 110G in the green light emitting region G, the film 114G covering the lateral surface of the organic compound layer 117G can prevent the organic compound layer 117G from being exposed to the process gases during the above etching processes, and can prevent the organic compound layer 117G from being exposed to atmospheric water or oxygen. Consequently, the film 114G can prevent deterioration of the organic compound layer 117G. The film 114G also covers the lateral surface of the second electrode 116G and thus can protect the second electrode 116G from damage caused by etching and other steps and from contact with atmospheric water, oxygen, or the like.

Figure 13:
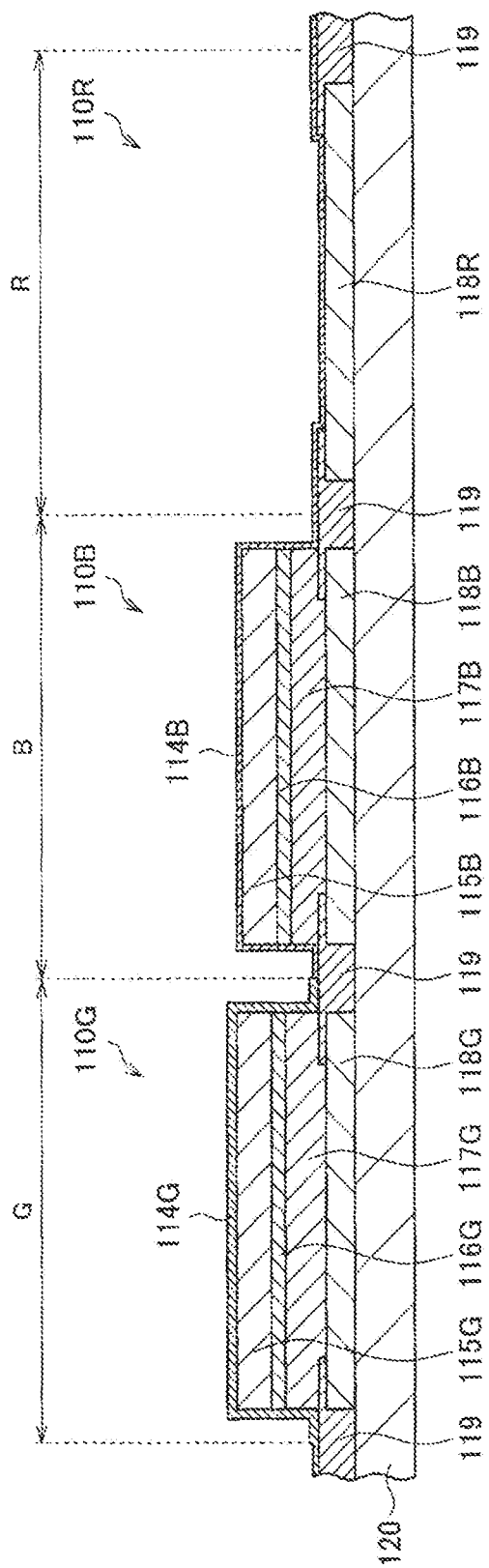
FIG. 13 is a view illustrating an example step in the manufacturing of an organic EL device according to the embodiment.

Next, referring to FIG. 13, a film 114B covering the lateral surfaces of the organic compound layer 117B and the second electrode 116B is formed. Specifically, a film 114B is formed uniformly over the green light emitting region G, the blue light emitting region B and a red light emitting region R (that is, the entire surface of the substrate 120). The film 114B may be formed in the same manner as the formation of the film 114G.

For example, the film 114B may be formed by an ALD method using the same material as the film 114G (for example, AlO). In this case, AlO is deposited to form the film 114B and is also deposited on the film 114G, and consequently the film 114G is increased in film thickness. Thus, the film thickness of the film 114G becomes larger than the film thickness of the film 114B. The film 114G and the film 114B may be formed with different film thicknesses, or may be formed so as to have the same film thickness and to differ in film quality or materials. When the film 114G and the film 114B are to be formed with the same film thickness, the film 114G formed thicker than the film 114B may be reduced in thickness by etching or the like to the film thickness of the film 114B. In this manner, the film 114G and the film 114B having similar film thicknesses may be formed.

Alternatively, the film 114B may be formed of a material different from the material forming the film 114G directly on the hard mask 115G. When, for example, the film 114G directly on the hard mask 115G is formed of AlO and the film 114B is formed of a material different from AlO, the film 114G that is formed is a layered film including a layer of AlO and a layer of the dissimilar material.

Still alternatively, the film 114B that is formed may be the same in material and be different in film quality from the film 114G. Some example factors that affect the film quality are the conditions under which the individual films are produced, such as film formation methods, film formation pressures, film formation temperatures, film formation powers, and the types, mixing ratios and flow rates of process gases. For example, the film quality may be the film density or the film hardness. As described above, the film 114B may be formed under different film formation conditions from the film 114G.

Figure 14:
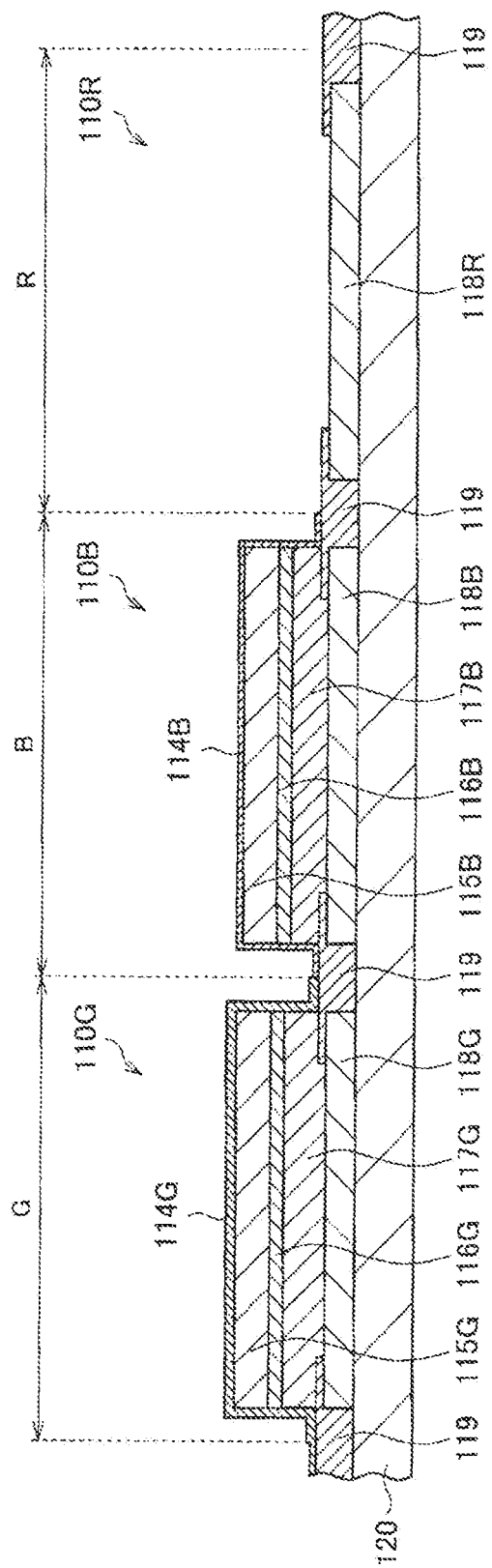
FIG. 14 is a view illustrating an example step in the manufacturing of an organic EL device according to the embodiment.

Next, referring to FIG. 14, the film 114B in the red light emitting region R is removed by etching. The removal of the film 114B from the red light emitting region R may be performed by the same etching as for the film 114G. The film 114B formed on the green light emitting region G may be left or may be removed.

Specifically, a resist is formed over the film 114G and the film 114B in the green light emitting region G and the blue light emitting region B, and dry etching or the like is performed using the resist as a mask to remove the film 114B in the red light emitting region R.

By the process so far, the formation of the subpixel 110B that emits blue light is completed. Subsequently, a subpixel 110R that emits red light is formed in the same manner as the formation of the subpixel 110G that emits green light and the subpixel 110B that emits blue light. The production of the subpixel 110R that emits red light will be described with reference to FIGS. 15 to 18.

Figure 15:
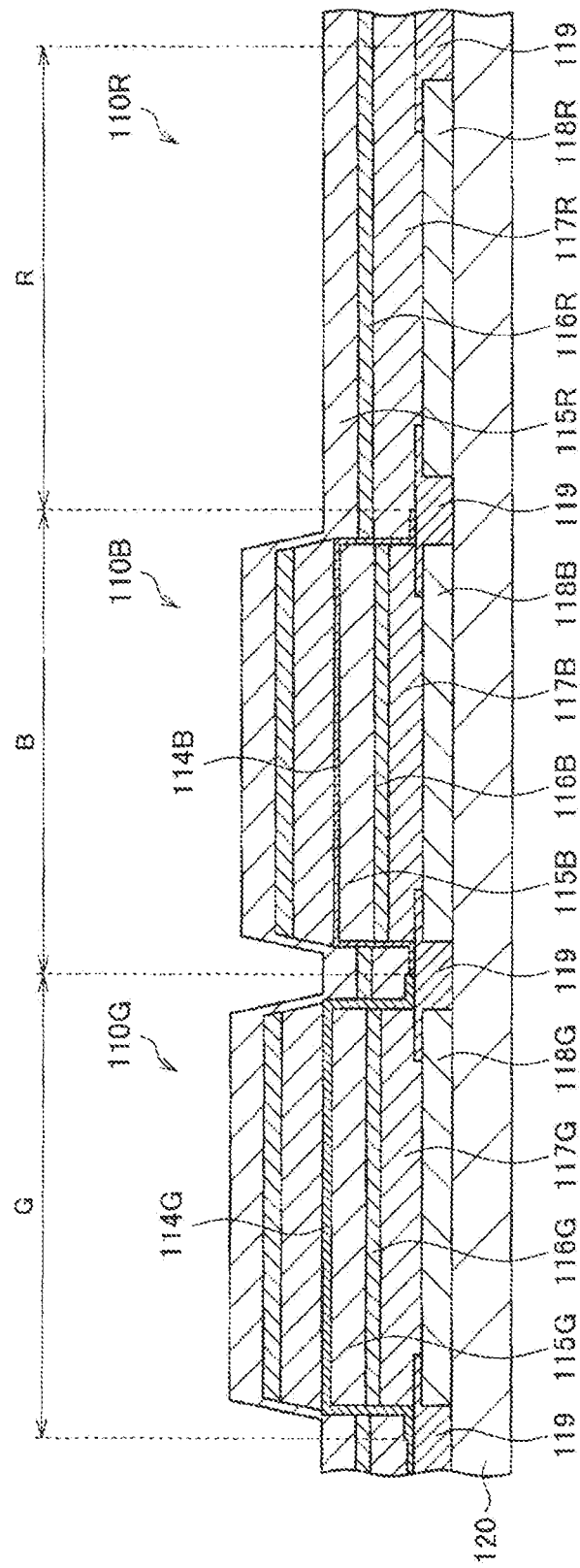
FIG. 15 is a view illustrating an example step in the manufacturing of an organic EL device according to the embodiment.

Referring to FIG. 15, an organic compound layer 117R that emits red light, a second electrode 116R and a hard mask 115R are formed on the entire surface of the substrate 120 in the same manner as the formation of the subpixel 110G that emits green light and the subpixel 110B that emits blue light.

Figure 16:
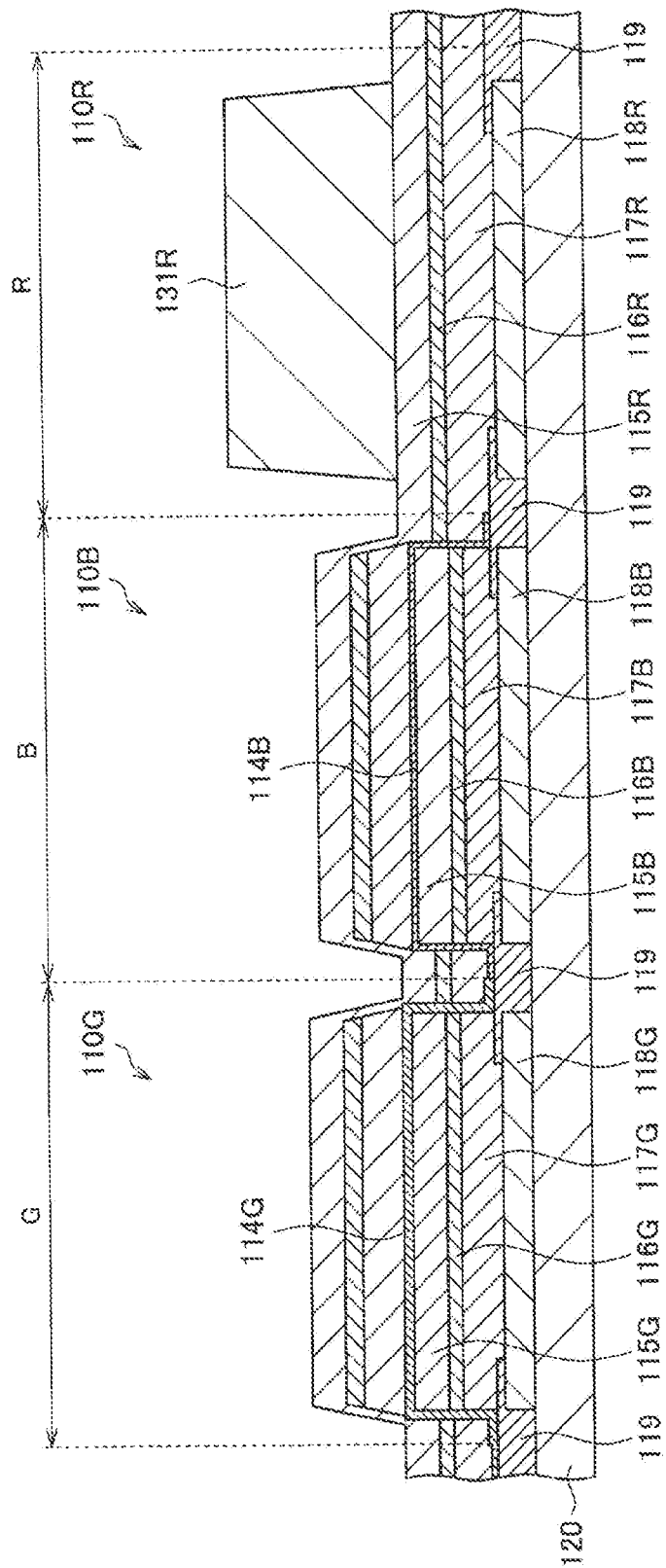
FIG. 16 is a view illustrating an example step in the manufacturing of an organic EL device according to the embodiment.

Next, referring to FIG. 16, a resist 131R having the same planar shape as the planar shape of the first electrode 118R is formed by photolithography over the desired portion of the hard mask 115R. The resist 131R functions as a mask during the etching of the hard mask 115R.

Figure 17:
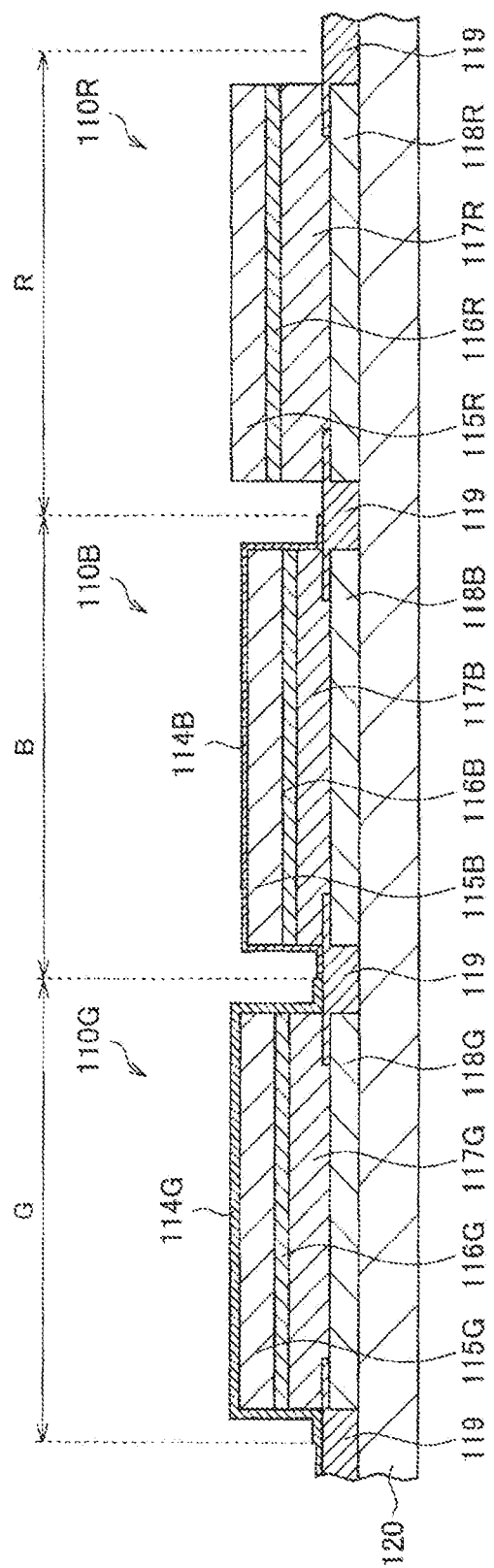
FIG. 17 is a view illustrating an example step in the manufacturing of an organic EL device according to the embodiment.

Next, referring to FIG. 17, steps are performed for the formation of a subpixel 110R that emits red light in the same manner as the steps of forming the subpixel 110G that emits green light and the steps of forming the subpixel 110B that emits blue light. Specifically, the hard mask 115R is patterned by etching using the resist 131R as a mask, and furthermore, the second electrode 116R and the organic compound layer 117R are patterned by etching through the hard mask 115R as a mask. The resist 131R may be removed by asking or the like.

Here, in the subpixel 110G in the green light emitting region G and the subpixel 110B in the blue light emitting region B, the film 114G and the film 114B cover the lateral surfaces of the organic compound layer 117G and the organic compound layer 117B. Thus, the film 114G and the film 114B can prevent the organic compound layer 117G and the organic compound layer 117B from, for example, damage by the etching processes during the etching of the subpixel 110R in the red light emitting region R, and can also prevent them from contact with atmospheric water or oxygen. Consequently, the film 114G and the film 114B can prevent deterioration of the organic compound layer 117G and the organic compound layer 117B.

Figure 18:
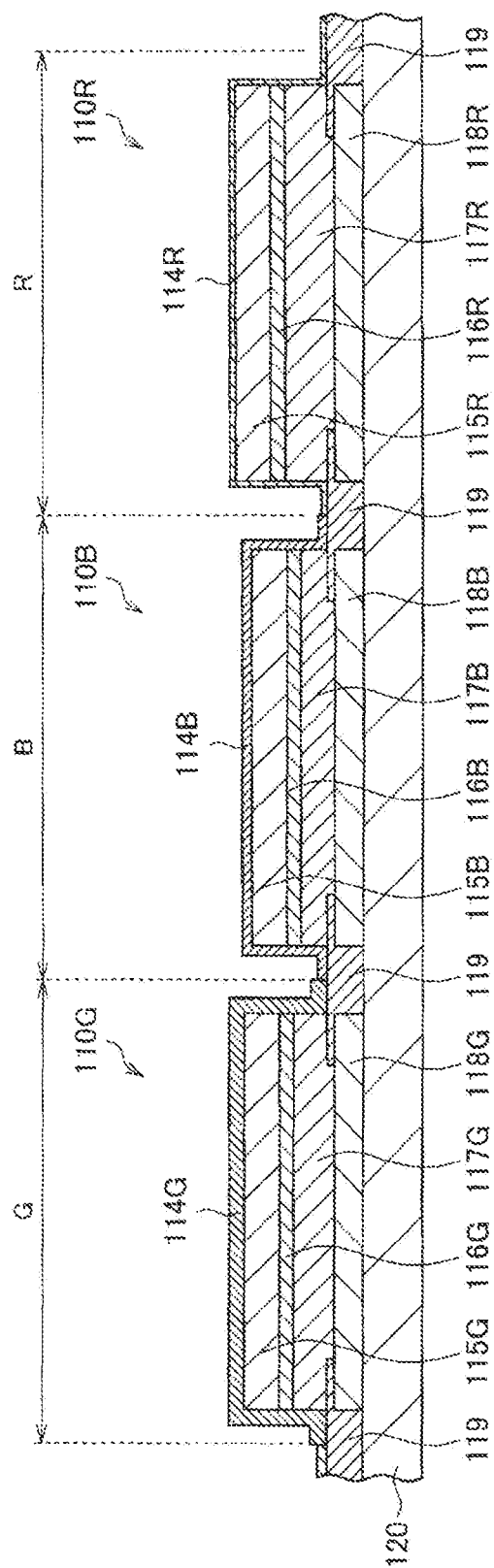
FIG. 18 is a view illustrating an example step in the manufacturing of an organic EL device according to the embodiment.

Next, referring to FIG. 18, a film 114R covering the lateral surfaces of the organic compound layer 117R and the second electrode 116R is formed. Specifically, a film 114R is formed uniformly over the green light emitting region G, the blue light emitting region B and the red light emitting region R (that is, the entire surface of the substrate 120). The film 114R may be formed in the same manner as the formation of the film 114G and the formation of the film 114B.

For example, the film 114R may be formed by an ALD method using the same material as the film 114G and the film 114B (for example, AlO). In this case, AlO is deposited to form the film 114R and is also deposited on the film 114G, and consequently the film 114G is further increased in film thickness. Thus, the film 114G, the film 114B and the film 114R are such that the film 114G is the thickest, the film 114B is the second thickest and the film 114R is the thinnest. The film 114G, the film 114B and the film 114R in the subpixels emitting light of different colors may be formed with different film thicknesses as described above, or may be formed so as to have the same film thickness and to differ in film quality or materials. When the film 114G, the film 114B and the film 114R are to be formed with the same film thickness, for example, the film 114G and the film 114B formed thicker than the film 114R may be reduced in thickness by etching or the like to the film thickness of the film 114R. In this manner, the film 114G, the film 114B and the film 114R having similar film thicknesses may be formed.

Alternatively, the film 114R may be formed of a material different from the material forming the film 114G directly on the hard mask 115G and the material forming the film 114B directly on the hard mask 115B (for example, AlO). In this case, the film 114G and the film 114B that are formed are each a layered film including a layer of AlO and a layer of the dissimilar material.

Still alternatively, the film 114R that is formed may be the same in material and be different in film quality from the film 114G and the film 114B. Some example factors that affect the film quality are the conditions under which the individual films are produced, such as film formation methods, film formation pressures, film formation temperatures, film formation powers, and the types, mixing ratios and flow rates of process gases. For example, the film quality may be the film density or the film hardness. As described above, the film 114R may be formed under different film formation conditions from the film 114G and the film 114B.

By the method for manufacturing organic EL devices described so far, the organic compound layers 117 and the second electrodes 116 in the subpixels emitting light of different colors are covered with dissimilar films. After these films are formed, as illustrated in FIG. 1, a filler layer 113 is formed that is common to all the subpixels. The filler layer 113 may be formed of at least an organic resin that protects the entire surface of the stack structures of the subpixels. With this configuration, the filler layer 113 sealing the organic EL device 100 can prevent the stack structures from external influences, specifically, the filler layer 113 can protect from damage caused by the process gases during manufacturing, and contact with atmospheric water or oxygen.

Before the formation of the filler layer 113, a common gas barrier layer that covers all the subpixels may be formed on top of the films 114. The gas barrier layer may be formed using a film formation method such as a CVD method, a MOCVD (metal organic chemical vapor deposition) method or an ALD method. Furthermore, the gas barrier layer is desirably formed at a film formation temperature of 150° C. or less in order to prevent a decrease in brightness due to the deterioration of the organic compound layers 117, and is also desirably formed under such conditions that the stress in the gas barrier layer is minimized to ensure that the gas barrier layer will not separate.

After the formation of the filler layer 113, a counter glass 111 to which color filters 112 are bonded may be bonded onto the filler layer 113. Alternatively, color filters may be formed prior to the formation of the filler layer by an OCCF (on-chip color filter) method in which color resists are formed on top of the films 114 or the gas barrier layer by photolithography. Incidentally, the color filters may be omitted in some cases.

The film thicknesses, film qualities and materials of the films 114 formed on the lateral surfaces of the organic compound layers 117 are not limited to the examples described hereinabove and may be determined appropriately as long as the films differ from one another in any one or more characteristics. Furthermore, the films 114 may be each formed of a combination of films. While the embodiment described hereinabove has illustrated that the subpixels are produced in the order of the green light emitting region G, the blue light emitting region B and the red light emitting region R, the order in which the subpixels are produced is not limited to this example.

4. Modified Examples

The method for manufacturing the organic EL device illustrated in FIG. 1 has been described hereinabove. In the technique of the present disclosure, films 114 are formed on the lateral surfaces of organic compound layers 117 to protect the organic compound layers 117 from damage caused by the process during the manufacturing of the organic EL device and to protect the organic compound layers from deterioration by contact with atmospheric water or oxygen. Some modified examples of the structure illustrated in FIG. 1 that protects the lateral surfaces of the organic compound layers 117 by the films 114 will be described hereinbelow with reference to FIGS. 19 to 22. The description of the same structures as in FIG. 1 will be omitted, and the features different from those in FIG. 1 will be described. In modified examples shown in FIGS. 19 to 22, the reference has been made with reference numbers as being the same as in FIG. 1 except that "1" at the beginning of the reference numeral is replaced by "2" in FIG. 19, "3" in FIG. 20, "4" in FIG. 21, and "5" in FIG. 22.

Modified Example 1

Figure 19:
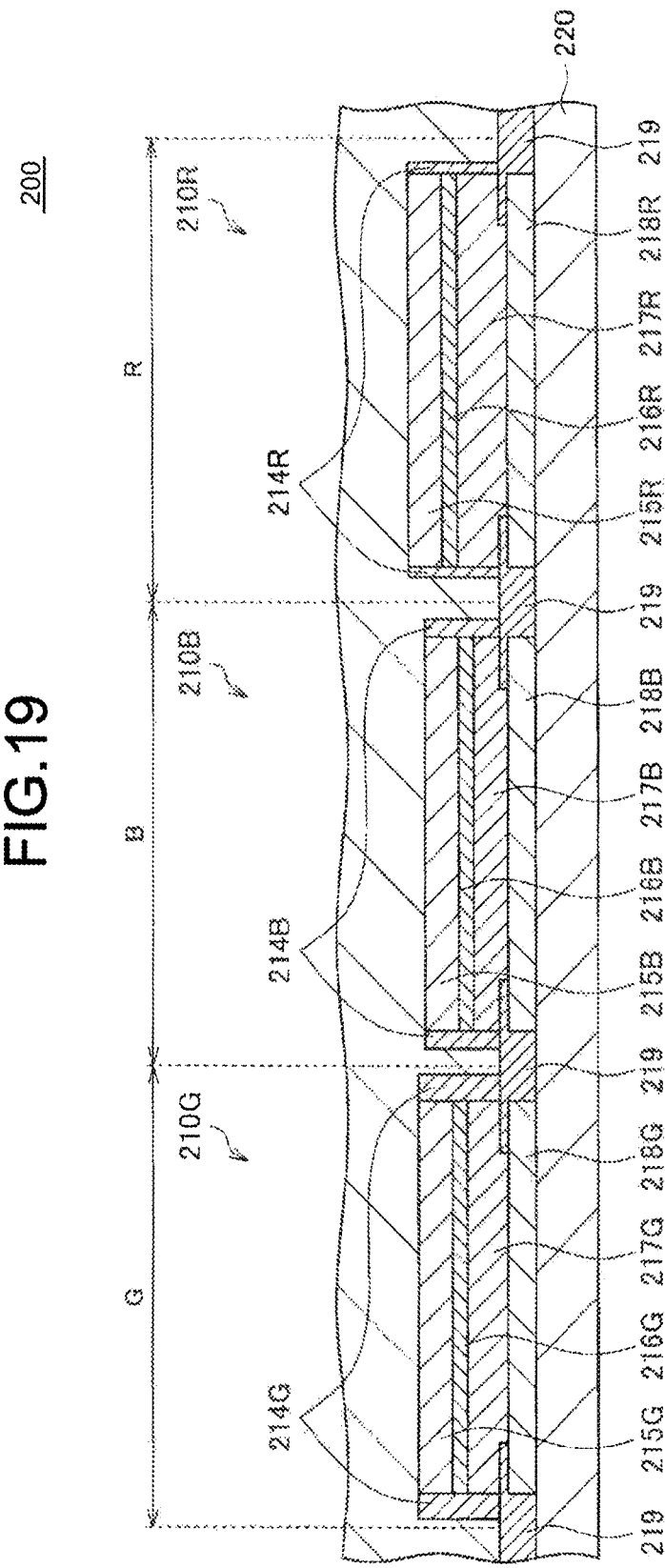
FIG. 19 is a sectional view illustrating a modified example of the organic EL devices according to the embodiment.

FIG. 19 is a view illustrating a modified example (modified example 1) of the organic EL devices according to the embodiment described above. In FIG. 19, the color filters, the black matrix and the counter glass are omitted from the illustration. An organic EL device 200 differs from the organic EL device 100 illustrated in FIG. 1 in that a film 214G, a film 214B and a film 214R are formed only on both lateral surfaces of a subpixel 210G, a subpixel 210B and a subpixel 210R. Specifically, the film 214G, the film 214B and the film 214R are formed only on the adjacent lateral surfaces of the subpixel 210G, the subpixel 210B and the subpixel 210R including the lateral surfaces of an organic compound layer 217G, an organic compound layer 217B and an organic compound layer 217R, respectively. That is, there are no films 214 formed over subpixels 210, specifically, over hard masks 215. The organic EL device 200 differs from the organic EL device 100 in this respect.

In the modified example 1, the film 214G, the film 214B and the film 214R are formed during the dry etching of organic compound layers 217 in the production steps described hereinabove, that is, formed at the same time as the dry etching of the organic compound layers 217 in the manner described below. For example, a gas having a relatively high carbon content such as $C_4F_8$ may be used as the etching gas. The etching deposits an organic material, specifically, a fluorine-containing hydrocarbon such as a CF polymer on the lateral surface of the organic compound layer 217, thereby forming a film 214. The film 214 are formed of materials differing depending on the types of the gases that are used or the types of the materials that are etched. The materials of the film 214 may be determined appropriately. For example, the film 214 may be formed of a reaction product containing halogen, silicon or oxygen. According to this technique, the dry etching and the formation of the film 214 are performed concurrently to further reduce the risk of the lateral surface of the organic compound layer 217 being exposed to the outside air between when the lateral surface is exposed by dry etching and when the film 214 is formed. Furthermore, the organic EL device of the modified example 1 may be manufactured without the need of forming the films 214 in separate steps and thus may be manufactured with less steps as compared to the above-described organic EL device illustrated in FIG. 1.

The film 214G, the film 214B and the film 214R illustrated in the modified example 1 may be formed at the same time as dry etching as described above, or may be formed by the application of a sidewall forming technique. When a sidewall technique is applied, the organic compound layer 217 is dry etched and thereafter a film 214 may be formed in the subpixel so as to bury the subpixel constituents, and the film 214 may be anisotropically etched to remain only on the lateral surface of the organic compound layer 217. In this manner, the organic compound layer 217 may be covered with the film 214. According to this technique, the film 214 is not formed over the entirety of the subpixel 210G, the subpixel 210B and the subpixel 210R, and thus the step of patterning the film 214 using a resist may be eliminated.

Modified Example 2

Figure 20:
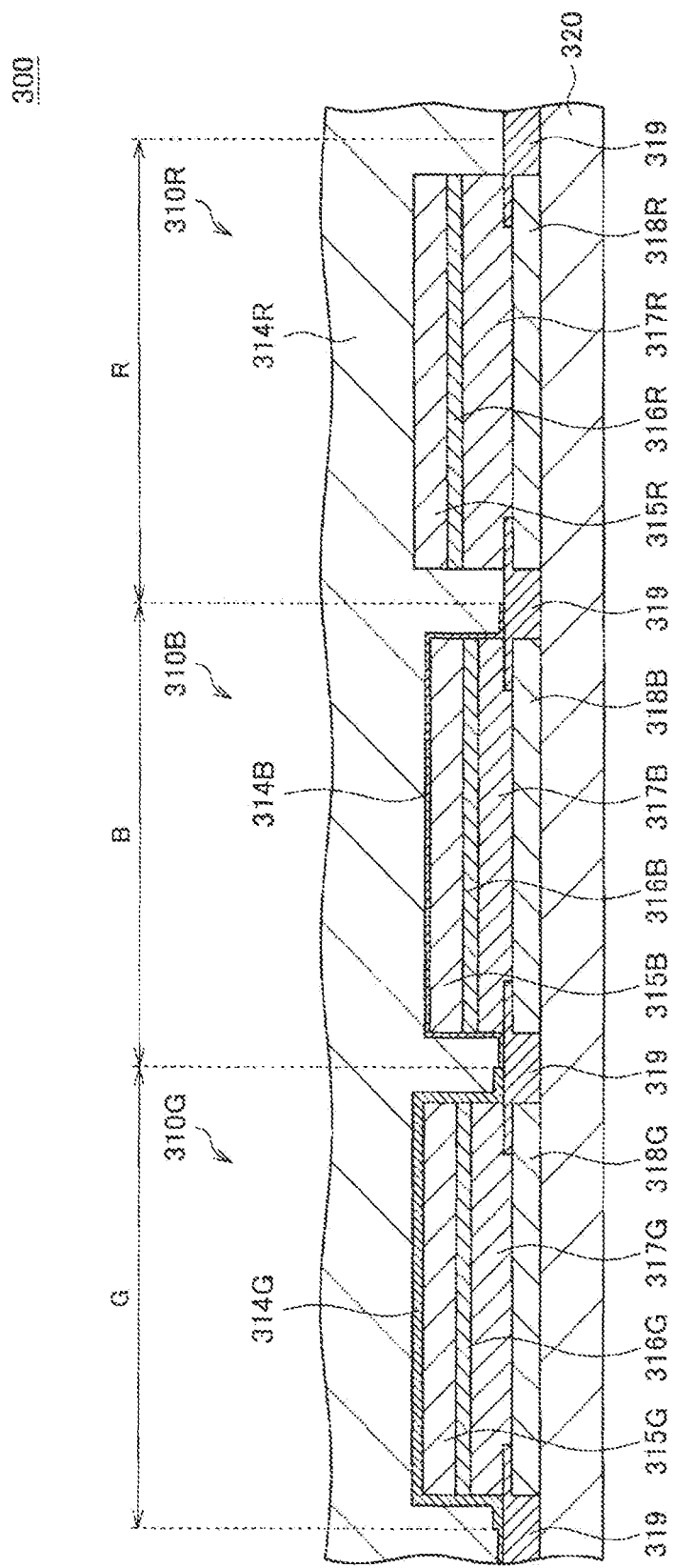
FIG. 20 is a sectional view illustrating a modified example of the organic EL devices according to the embodiment.

FIG. 20 is a view illustrating a modified example (modified example 2) of the organic EL devices according to the embodiment described above. In FIG. 20, the filler layer, the color filters, the black matrix and the counter glass are omitted from the illustration. An organic EL device 300 differs from the organic EL device 100 illustrated in FIG. 1 in that a subpixel 310G that emits green light and a subpixel 310B that emits blue light are covered with a film 314G and a film 314B, while a subpixel 310R that emits red light is free from a corresponding film on the lateral surface. Instead, the lateral surface of the subpixel 310R is covered with a common protective film 314R that is formed over the entirety of the subpixel 310G, the subpixel 310B and the subpixel 310R. Specifically, the protective film 314R may be a gas barrier layer. After the protective film 314R is formed, a filler layer may be formed on top of the protective film 314R. In this example, the subpixel that is formed last is the subpixel 310R. After the formation of the subpixel 310R, there are no steps of dry etching an organic compound layer for forming another subpixel and thus an organic compound layer 317R is not exposed to etching process gases. Furthermore, it is needless to mention that the protective film 314R can prevent the organic compound layer from contact with atmospheric water oxygen, or the like. Thus, the organic compound layer in the organic EL device 300 can be prevented from deterioration by virtue of the protective film 314R.

Modified Example 3

Figure 21:
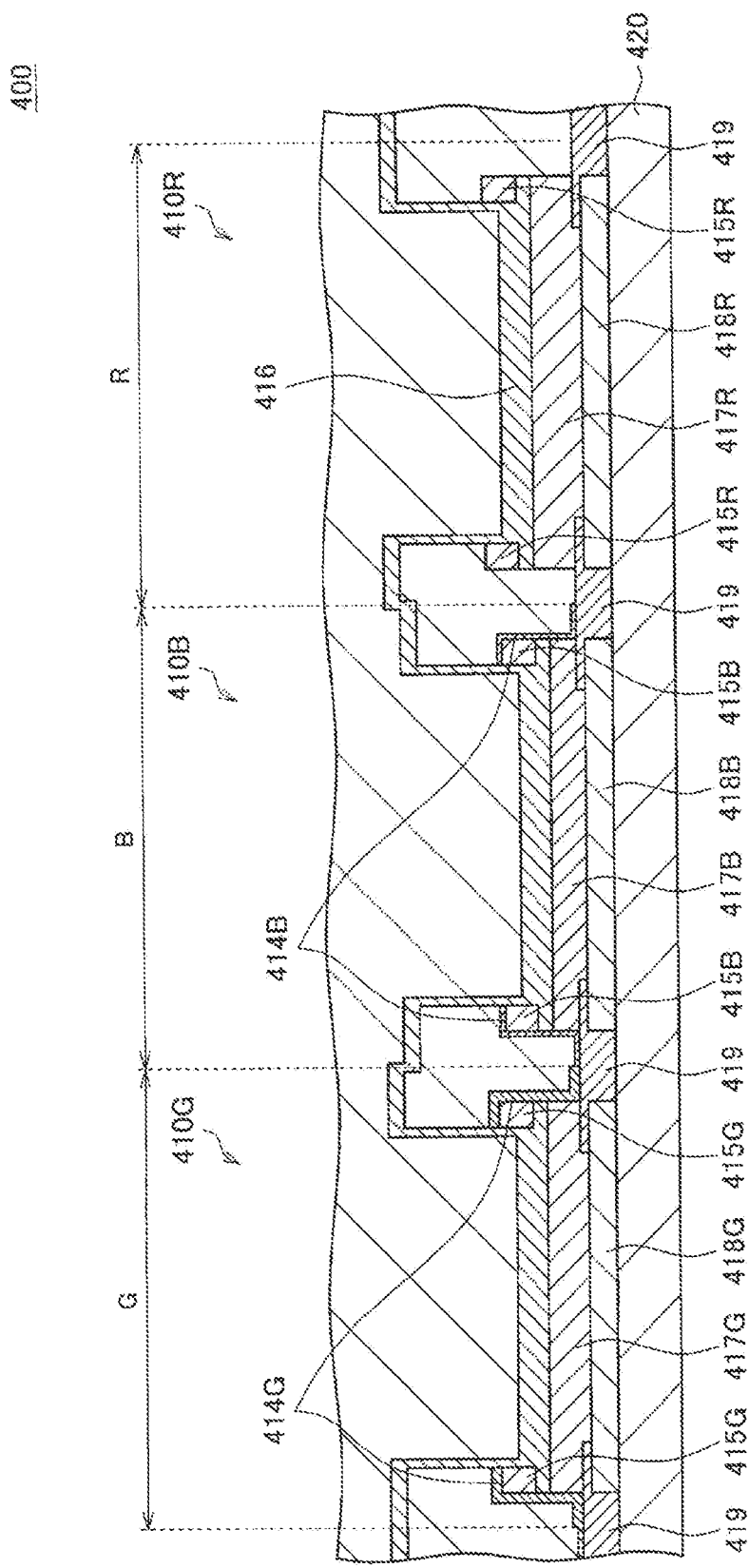
FIG. 21 is a sectional view illustrating a modified example of the organic EL devices according to the embodiment.

FIG. 21 is a view illustrating a modified example (modified example 3) of the organic EL devices according to the embodiment described above. In FIG. 21, the filler layer, the color filters, the black matrix and the counter glass are omitted from the illustration. An organic EL device 400 further differs from the organic EL device 300 illustrated in FIG. 20 in that a common electrode 416 is formed continuously over a subpixel 410G, a subpixel 410B and a subpixel 410R that emit light of different colors. Specifically, while a second electrode 316G, a second electrode 316B and a second electrode 316R in the subpixels illustrated in FIG. 20 are stacked on an organic compound layer 317G, an organic compound layer 317B and the organic compound layer 317R, the organic EL device 400 illustrated in FIG. 21 is such that the second electrode 316G, the second electrode 316B and the second electrode 316R of the subpixels adjacent to one other are electrically connected together. In FIG. 21, a second electrodes 316 that are arranged individually in the respective subpixels in FIG. 20 are connected to one another to form the common electrode 416.

In the example illustrated in FIG. 21, as described above, the second electrodes 316 are united into the common electrode 416 that is electrically continuous throughout the subpixels. However, the present modified example is not limited to this configuration. For example, second electrodes 316 may be individually stacked on an organic compound layers 317 in the respective subpixels as illustrated in FIG. 20, and a common electrode may be further provided continuously on the second electrodes 316 of the adjacent subpixels. Furthermore, in these structures, the second electrodes 316 or the common electrode 416 may be formed of a material that transmits part of light and reflects other part of the light. When the second electrodes 316 or the common electrode 416 is made of such a material, the amplification of light quantity by the microcavity effect can be expected.

Modified Example 4

Figure 22:
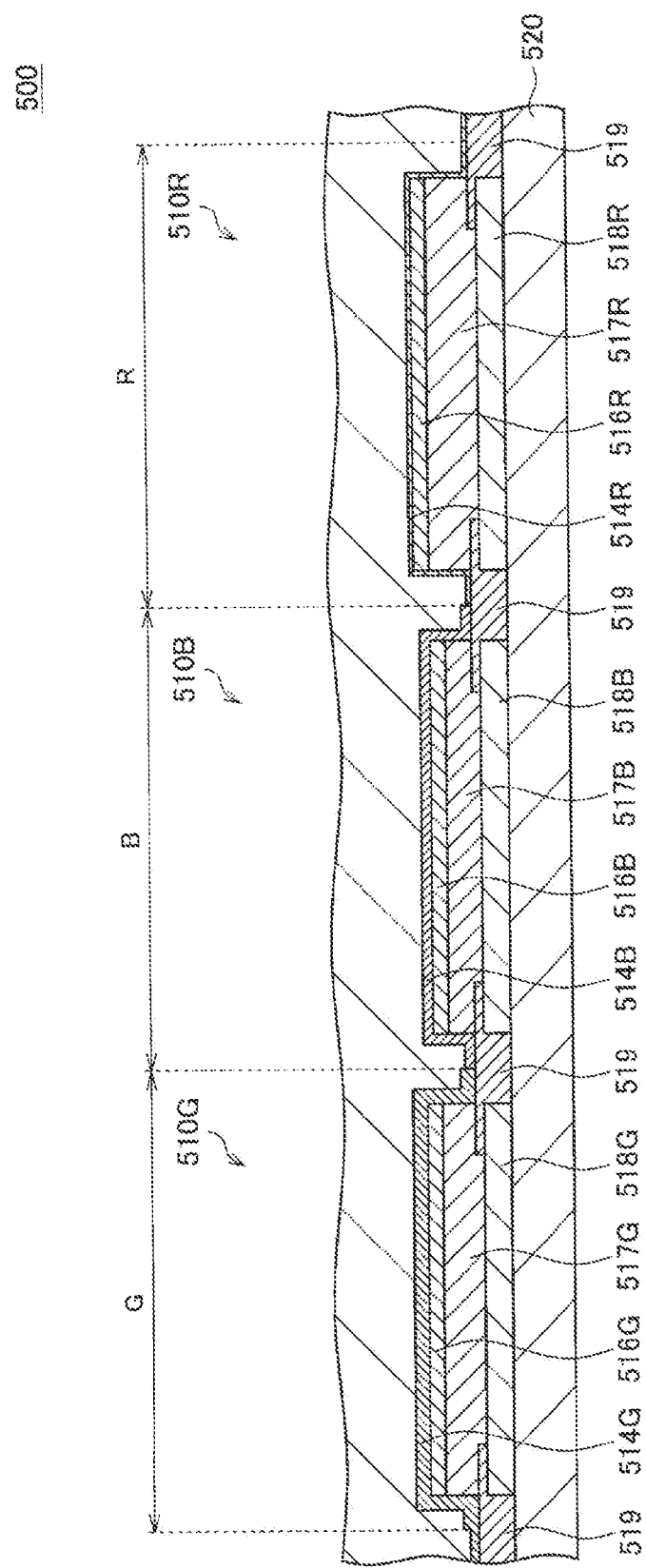
FIG. 22 is a sectional view illustrating a modified example of the organic EL devices according to the embodiment.

FIG. 22 is a view illustrating a modified example (modified example 4) of the organic EL devices according to the embodiment described above. In FIG. 22, the color filters, the black matrix and the counter glass are omitted from the illustration. An organic EL device 500 differs from the organic EL device 100 illustrated in FIG. 1 in that there are no hard masks 115. Specifically, in the organic EL device 500, a film 514G, a film 514B and a film 514R are disposed on a second electrode 516G, a second electrode 516B and a second electrode 516R in a subpixel 510G, a subpixel 510B and a subpixel 510R, respectively. This configuration also prevents an organic compound layer 517G, an organic compound layer 517B and an organic compound layer 517G from exposure to a gas such as the atmospheric air or process gases by virtue of the film 514G, the film 514B and the film 514R.

5. Planar Layouts of Organic EL Devices

Some modified examples of the structures of the organic EL devices according to the present embodiment have been illustrated hereinabove. Next, some examples of the planar arrangements of the subpixels illustrated in FIG. 1 will be described with reference to FIGS. 23 to 26. FIGS. 23 to 26 are views illustrating examples of the layouts of the planar arrangements of the subpixels.

The rectangles illustrated in FIGS. 23 to 26 each represent a pixel opening, and G, B, and R written in the rectangles indicate a subpixel G that emits green light, a subpixel B that emits blue light, and a subpixel R that emits red light, respectively. The broken lines indicate divisions of organic compound layers.

Figure 23:
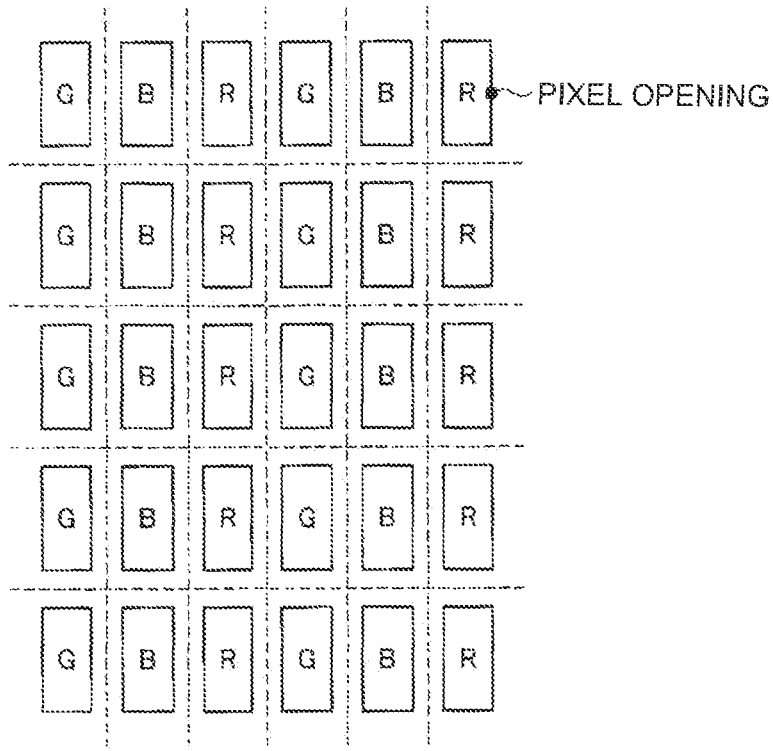
FIG. 23 is a view illustrating an example of the layouts of planar arrangements of subpixels.

Referring to FIG. 23, subpixels G, subpixels B and subpixels R are sequentially arranged side by side at regular intervals in a first direction (in the horizontal direction as viewed correctly from the front of FIG. 23). The subpixels G, the subpixels B and the subpixels R are separate from one another, and the organic compound layers in the respective subpixels are divided. Furthermore, in a second direction perpendicular to the first direction (in the vertical direction as viewed correctly from the front of FIG. 23), the subpixels of the same color are arranged at intervals, and the organic compound layers in the respective subpixels are divided. The subpixels may be arranged in this layout. In some cases, the subpixel B may have a lower light quantity per unit area than the subpixel G and the subpixel R. Thus, the pixel area may be enlarged to increase the light quantity of the whole subpixel to substantially the same level as the light quantity of the subpixel G and that of the subpixel R.

Figure 24:
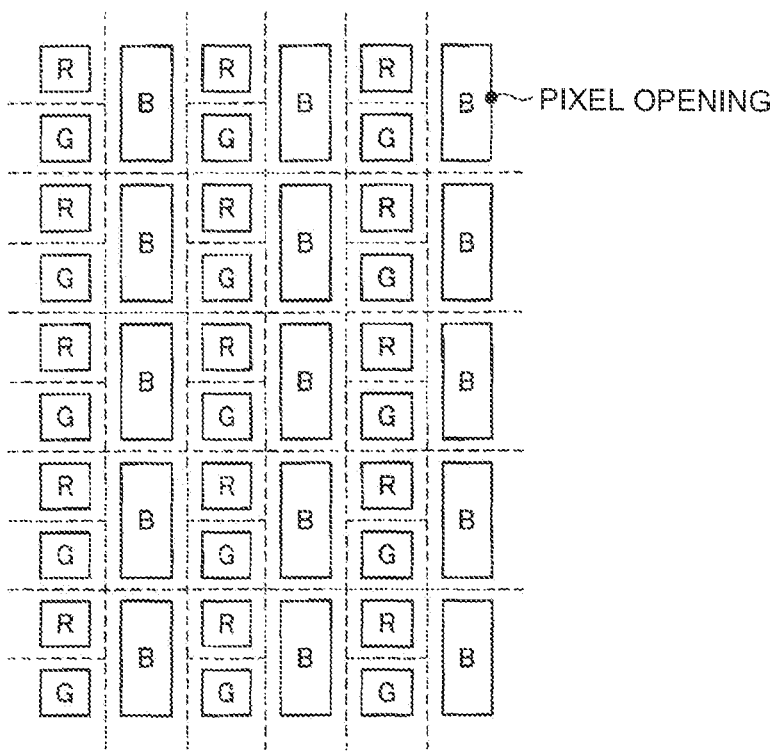
FIG. 24 is a view illustrating an example of the layouts of planar arrangements of subpixels.

Referring to FIG. 24, the subpixels R and the subpixels G are sequentially arranged side by side in the second direction (the vertical direction as viewed correctly from the front of FIG. 24). In the first direction perpendicular to the second direction (in the horizontal direction as viewed correctly from the front of FIG. 24), the subpixels B each having a length similar to the total length of the subpixel R and the subpixel G in the second direction are arranged adjacent to the subpixel R and the subpixel G. In the first direction, these subpixels R, subpixels G and subpixels B are arranged repeatedly side by side. In the second direction, the subpixels R, the subpixels G and the subpixels B are similarly arranged repeatedly side by side. The subpixels are separate from one another, and the organic compound layers in the respective subpixels are divided. The subpixels may be arranged in this layout.

Figure 25:
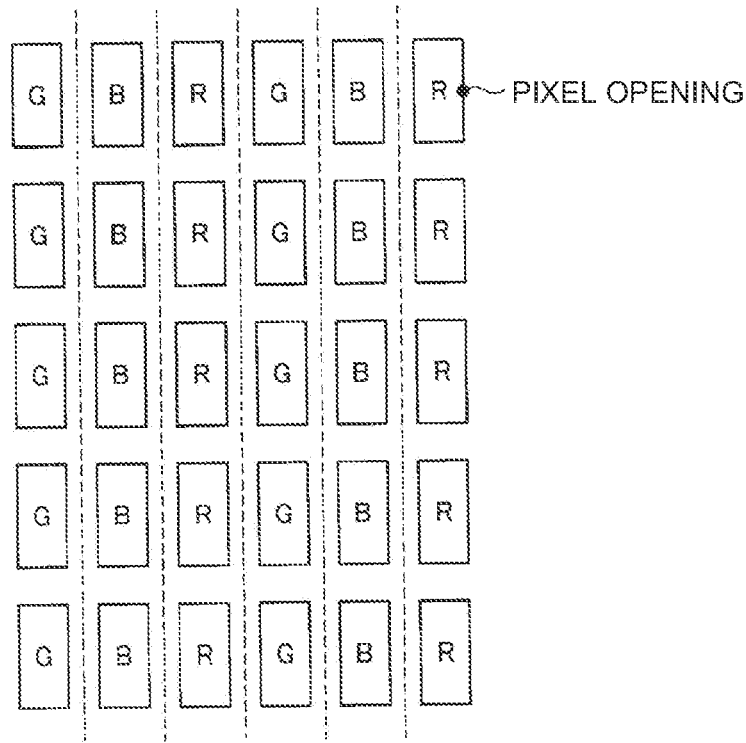
FIG. 25 is a view illustrating an example of the layouts of planar arrangements of subpixels.

Referring to FIG. 25, the subpixels G, the subpixels B and the subpixels R are sequentially arranged at regular intervals in the first direction (the horizontal direction as viewed correctly from the front of FIG. 25) similarly to FIG. 24. The subpixels G, the subpixels B and the subpixels R are separate from one another, and the organic compound layers in the respective subpixels are divided. On the other hand, in FIG. 25, the subpixels of the same color are arranged at intervals in the second direction perpendicular to the first direction (in the vertical direction as viewed correctly from the front of FIG. 25), and the organic compound layers in the subpixels of the same emission color are not divided. Even in this case in which the organic compound layers in the subpixels are continuous, the subpixels may be driven independently by forming the first electrodes 118 or the second electrodes 116 as divided electrodes in the respective subpixels. According to this configuration, the patterning of the organic compound layers may be simplified, and the manufacturing of the organic EL devices 100 may be further facilitated.

Figure 26:
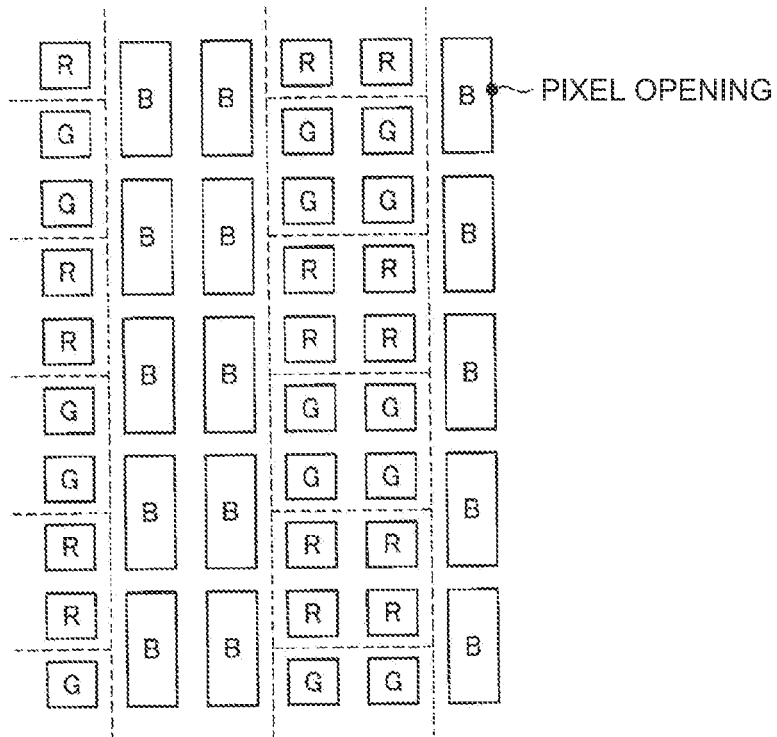
FIG. 26 is a view illustrating an example of the layouts of planar arrangements of subpixels.

Referring to FIG. 26, similarly to FIG. 24, the subpixels R and the subpixels G are sequentially arranged side by side in the second direction (the vertical direction as viewed correctly from the front of FIG. 26). In the first direction perpendicular to the second direction (in the horizontal direction as viewed correctly from the front of FIG. 26), the subpixels B each having a length similar to the total length of the subpixel R and the subpixel G in the second direction are arranged adjacent to the subpixel R and the subpixel G. In the first direction, these subpixels R, subpixels G and subpixels B are arranged repeatedly side by side. Furthermore, in the second direction, the subpixels R, the subpixels G and the subpixels B are similarly arranged repeatedly side by side. On the other hand, in FIG. 26, the organic compound layers in the adjacent subpixels of the same color are not divided. As described herein, the organic compound layer may be continuous in a plurality of subpixels of the same color. Even in this case in which the organic compound layers in the subpixels are continuous, the subpixels may be driven independently by forming the first electrodes 118 or the second electrodes 116 as divided electrodes in the respective subpixels. According to this arrangement example, the minimum size of the organic compound layers that are processed may be increased, and a larger dimensional variation may be accepted in the patterning of the organic compound layers. Thus, the organic compound layers may be formed by a simpler processing technique.

The present disclosure may be applied to subpixels having a planar size of, for example, 100 μm or less, or as small as 10 μm or less in the longer side of the rectangle as the subpixel.

While the present embodiment has illustrated the subpixels as being rectangular, the subpixels are not limited thereto and may have any of various planar shapes. In such cases, for example, when the subpixels are triangles, the planar size may be the dimension of the longer side, and the like. When the subpixels are pentagons or higher polygons, the planar size may be the diameter of a circumscribed circle of the polygon, and the like. Furthermore, when the subpixels are circles, the planar size may be the diameter, or when the subpixels are ellipses, the planar size may be the dimension of the longest diameter. The technique of the present disclosure may be applied particularly effectively to the fine processing for the formation of subpixels having such planar sizes.

While preferred embodiments of the present disclosure have been described in detail hereinabove with reference to the accompanying drawings, the technical scope of the present disclosure is not limited to such examples. As will be apparent to a person having ordinary knowledge in the technical field of the present disclosure, various modifications or alterations are possible within the scope of the technical ideas described in the claims, and such modifications and alterations are naturally understood as belonging to the technical scope of the present disclosure.

Furthermore, the advantageous effects described in the present specification are only explanatory or illustrative and are not limitative. That is, the technique according to the present disclosure may produce effects apparent to those skilled in the art from the description in the present specification, in addition to or in place of the advantageous effects described hereinabove.

The technical scope of the present disclosure also includes those configurations described below.

(1)
    An organic EL device comprising at least two or more subpixels each including an organic compound layer including at least a light-emitting layer that emits light of a different color from the other light-emitting layer(s), the organic compound layer being interposed between a first electrode and a second electrode in a stacking manner, the subpixels being disposed separately from one another on a plane perpendicular to a direction of the stacking, wherein
    lateral surfaces of the organic compound layers are covered with films differing from subpixel to subpixel.

(2)
    The organic EL device according to (1), wherein the films differ from subpixel to subpixel in at least any one or more of film thickness, film quality and film materials.

(3)
    The organic EL device according to (1) or (2), wherein at least one or more of the films comprise an inorganic material.

(4)
    The organic EL device according to (3), wherein at least one or more of the films comprise any one or more of AlO, TiO, SiN, SiON and SiO.

(5)
    The organic EL device according to (1) or (2), wherein at least one or more of the films comprise an organic material.

(6)
    The organic EL device according to (5), wherein the organic material is a hydrocarbon containing a fluorine atom.

(7)
    The organic EL device according to any one of (1) to (6), wherein
    the subpixels are formed by stacking the first electrode, the organic compound layer and the second electrode in the order named, and
    the films differing from subpixel to subpixel cover the lateral surfaces of the organic compound layers and further cover lateral surfaces of the second electrodes.

(8)
The organic EL device according to (7), wherein
the second electrode stacked on the organic compound layer is connected to the second electrode of the adjacent subpixel, or
a common electrode is further disposed on the second electrode stacked on the organic compound layer, the common electrode being continuously disposed on the second electrode of the adjacent subpixel.

(9)
The organic EL device according to (8), wherein the second electrodes or the common electrode transmits part of light and reflects other part of the light.

(10)
The organic EL device according to (7), wherein the second electrodes are cathodes.

(11)
The organic EL device according to (7), wherein the second electrodes comprise a metal oxide.

(12)
The organic EL device according to any one of (1) to (11), wherein the planar size of each of the subpixels is 100 μm or less.

(13)
The organic EL device according to any one of (1) to (11), wherein the planar size of each of the subpixels is 10 μm or less.

(14)
A method for manufacturing an organic EL device, the method comprising:
forming at least two or more subpixels each including an organic compound layer including at least a light-emitting layer that emits light of a different color from the other light-emitting layer(s), the organic compound layer being interposed between a first electrode and a second electrode in a stacking manner, the subpixels being formed separately from one another on a plane perpendicular to a direction of the stacking, wherein
the forming of the subpixels comprises forming a film that covers a lateral surface of the organic compound layer, every time the organic compound layer that emits light of a color is shaped.

REFERENCE SIGNS LIST

110 SUBPIXEL
111 COUNTER GLASS
112 COLOR FILTER
113 FILLER LAYER
114, 214, 312, 414, or 514 FILM
115, 215, 315, 415, or 515 HARD MASK
116, 216, 316, 416, or 516 SECOND ELECTRODE
117, 217, 317, 417, or 517 ORGANIC COMPOUND LAYER
118, 218, 318, 418, or 518 FIRST ELECTRODE
119, 219, 319, 419, or 519 WINDOW LAYER
120, 220, 320, 420, or 520 SUBSTRATE
131G, 131B, 131R RESIST

The invention claimed is:

1. An organic EL device, comprising:
at least two or more subpixels including a first subpixel and a second subpixel, wherein
the first subpixel comprises:
a first electrode;
a first organic compound layer on the first electrode, wherein the first organic compound layer has one or more first lateral surfaces;
a first light-emitting layer in the first organic compound layer, wherein the first light-emitting layer is configured to emit light of a first color;
a second electrode on the first organic compound layer, wherein the first electrode, the first organic compound layer, and the second electrode are stacked in a specific direction; and
a first film configured to cover the one or more first lateral surfaces, wherein the first film has a first thickness,
the second subpixel comprises:
a third electrode;
a second organic compound layer on the third electrode, wherein the second organic compound layer has one or more second lateral surfaces;
a second light-emitting layer in the second organic compound layer, wherein the second light-emitting layer is configured to emit a light of a second color different from the first color;
a fourth electrode on the second organic compound layer; and
a second film configured to cover the one or more second lateral surfaces,
the second film has a second thickness different from the first thickness, and
the first subpixel is spaced apart from the second subpixel on a plane perpendicular to the specific direction.

2. The organic EL device according to claim 1, wherein
the first film has a first film quality and includes one or more first film materials,
the second film has a second film quality and includes one or more second film materials, and
the second film quality is different from the first film quality or the one or more first film materials are different from the one or more second film materials.

3. The organic EL device according to claim 1, wherein at least one of the first film or the second film comprises inorganic material.

4. The organic EL device according to claim 3, wherein the inorganic material comprises one or more of AlO, TiO, SiN, SiON, or SiO.

5. The organic EL device according to claim 1, wherein at least one of the first film or the second film comprises an organic material.

6. The organic EL device according to claim 5, wherein the organic material is a hydrocarbon containing a fluorine atom.

7. The organic EL device according to claim 1, wherein
the second electrode has one or more third lateral surfaces,
the fourth electrode has one or more fourth lateral surfaces,
the first film is further configured to cover the one or more third lateral surfaces, and
the second film is further configured to cover the one or more fourth lateral surfaces.

8. The organic EL device according to claim 7, wherein the second subpixel is adjacent to the first subpixel, and the second electrode is connected to the fourth electrode.

9. The organic EL device according to claim 8, wherein at least one of the second electrode or the fourth electrode is configured to transmit a first part of the light and reflect a second part of the light.

10. The organic EL device according to claim 7, wherein the second electrode and the fourth electrode are cathodes.

11. The organic EL device according to claim 7, wherein the second electrode and the fourth electrode comprise a metal oxide.

12. The organic EL device according to claim 7, wherein the second subpixel is adjacent to the first subpixel,
the first subpixel further comprises a common electrode on the second electrode, and
the second subpixel further comprises the common electrode on the fourth electrode.

13. The organic EL device according to claim 12, wherein the common electrode is configured to transmit a first part of the light and reflect a second part of the light.

14. The organic EL device according to claim 1, wherein a planar size of each of the first subpixel and the second subpixel is 100 µm or less.

15. The organic EL device according to claim 1, wherein a planar size of each of the first subpixel and the second subpixel is 10 µm or less.

16. The organic EL device according to claim 1, wherein the first thickness differs from the second thickness based on an order of formation of the first subpixel and the second subpixel.

17. The organic EL device according to claim 1, wherein the first thickness differs from the second thickness based on a film forming method.

18. The organic EL device according to claim 1, wherein the first subpixel further comprises a first filler layer on the first film, and
the second subpixel further comprises a second filler layer on the second film.

19. A method for manufacturing an organic EL device, the method comprising:
forming at least two or more subpixels including a first subpixel and a second subpixel, wherein
the first subpixel comprises:
a first electrode;
a first organic compound layer on the first electrode, wherein the first organic compound layer has one or more first lateral surfaces;
a first light-emitting layer in the first organic compound layer, wherein the first light-emitting layer emits light of a first color; and
a second electrode on the first organic compound layer, wherein the first electrode, the first organic compound layer, and the second electrode are stacked in a specific direction,
the second subpixel comprises:
a third electrode;
a second organic compound layer on the third electrode, wherein the second organic compound layer has one or more second lateral surfaces;
a second light-emitting layer in the second organic compound layer wherein the second light-emitting layer emits a light of a second color different from the first color; and
a fourth electrode on the second organic compound layer, the first subpixel is spaced apart from the second subpixel on a plane perpendicular to the specific direction;
forming a first film, having a first thickness, to cover the one or more first lateral surfaces; and
forming a second film, having a second thickness to cover the one or more second lateral surfaces, wherein the first thickness is different from the second thickness.

* * * * *